United States Patent
Kim et al.

(10) Patent No.: US 11,320,259 B2
(45) Date of Patent: May 3, 2022

(54) SPECTROSCOPIC MEASURING APPARATUS AND METHOD, AND METHOD FOR FABRICATING SEMICONDUCTOR DEVICE USING THE MEASURING METHOD

(71) Applicant: SAMSUNG ELECTRONICS CO., LTD., Suwon-si (KR)

(72) Inventors: Kwangrak Kim, Gunpo-si (KR); Soonyang Kwon, Seoul (KR); Jangryul Park, Seoul (KR); Yunje Cho, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/185,270

(22) Filed: Feb. 25, 2021

(65) Prior Publication Data

US 2022/0049949 A1   Feb. 17, 2022

(30) Foreign Application Priority Data

Aug. 13, 2020   (KR) .................. 10-2020-0102057

(51) Int. Cl.
*G01B 11/06* (2006.01)
*H01L 21/66* (2006.01)
(Continued)

(52) U.S. Cl.
CPC ...... *G01B 11/0625* (2013.01); *G01B 11/0675* (2013.01); *G01B 11/2441* (2013.01); *H01L 21/67253* (2013.01); *H01L 22/20* (2013.01)

(58) Field of Classification Search
CPC ............. G01B 9/0203; G01B 9/02044; G01B 2290/45; G01B 11/0625; G01B 11/0675; G01B 11/2441
See application file for complete search history.

(56) References Cited

U.S. PATENT DOCUMENTS 8,857,028 B2   10/2014   Gates et al.
9,477,072 B2   10/2016   Cooper
(Continued)

FOREIGN PATENT DOCUMENTS

CN   108445261 A   8/2018
KR   10-0916618 B1   9/2009
WO   2019/002876 A2   1/2019

OTHER PUBLICATIONS

Sylvain Lecler et al., "Photonic jet lens", Scientific Reports, 9:4725, Mar. 18, 2019, pp. 1-8, 9 pages total.
(Continued)

*Primary Examiner* — Michael A Lyons
(74) *Attorney, Agent, or Firm* — Sughrue Mion, PLLC

(57) ABSTRACT

A spectroscopic measuring apparatus and method are provided. The apparatus includes a first light source, object, microlens, and imaging lenses, an optical fiber, a spectrometer and a position controller. The object lens to allows light from the first light source to be incident on a stage configured to support a measurement object. The microlens is disposed between the object lens and the stage. The imaging lens images light reflected from the measurement object. The optical fiber has an input terminal disposed on a first image plane of the imaging lens. The spectrometer is disposed at an output terminal of the optical fiber. The position controller controls positions of the object lens, the microlens, and the optical fiber, and adjusts the position of the object lens so that a focus of the object lens is positioned at a virtual image position of a virtual image generated by the microlens.

16 Claims, 22 Drawing Sheets

(51) Int. Cl.
*G01B 11/24* (2006.01)
*H01L 21/67* (2006.01)

(56) References Cited

U.S. PATENT DOCUMENTS

| | | |
|---|---|---|
| 9,488,810 B2 | 11/2016 | Mohseni |
| 9,880,378 B2 | 1/2018 | Taniguchi et al. |
| 9,952,140 B2 | 4/2018 | Wang et al. |
| 10,345,093 B2 | 7/2019 | Kassamakov et al. |
| 2011/0001988 A1* | 1/2011 | Pahk ................. G01B 11/0625 356/630 |
| 2018/0172431 A1* | 6/2018 | Okamoto ............. G01J 3/0248 |
| 2019/0293916 A1 | 9/2019 | Stanescu et al. |
| 2020/0103224 A1* | 4/2020 | Montgomery .......... G01B 9/04 |
| 2021/0302151 A1* | 9/2021 | Chen ................. G01B 11/0608 |

OTHER PUBLICATIONS

Feifei Wang et al., "Scanning superlens microscopy for non-invasive large field-of-view visible light nanoscale imaging", Nature Communications, 7:13748, DOI: 10.1038/ncomms13748, Dec. 9, 2016, pp. 1-10.

I. Kassamakov et al., "Label-free 3D super-resolution nanoscope", Proceedings of SPIE, vol. 11056, 110560S, Jun. 21, 2019, pp. 1-8, 9 pages total.

* cited by examiner

SPECTROSCOPIC MEASURING APPARATUS AND METHOD, AND METHOD FOR FABRICATING SEMICONDUCTOR DEVICE USING THE MEASURING METHOD

CROSS-REFERENCE TO RELATED APPLICATION

This application is based on and claims priority under 35 U.S.C. § 119 to Korean Patent Application No. 10-2020-0102057, filed on Aug. 13, 2020, in the Korean Intellectual Property Office, the disclosure of which is incorporated by reference herein in its entirety.

BACKGROUND

1. Field

The present disclosure relates to a measuring apparatus and method, and more particularly, to a measuring apparatus and method based on Spectroscopic Reflectometry (SR) or Spectroscopic Ellipsometry (SE) technology.

2. Description of Related Art

In order to measure physical quantities such as the structure or Critical Dimension (CD) of a pattern of a semiconductor device, or a thickness of a thin film, an electron microscope, Spectroscopic Ellipsometry (SE), and Spectroscopic Reflectometry (SR) are used. Among them, the electron microscope is a device that uses an electron beam and an electron lens to create a magnified image of an object in order to overcome the limitation of resolution of conventional optical microscopes and because microscopic observation is possible, the electron microscope is widely used for analysis of semiconductor devices. Furthermore, the SE or SR may measure the structure or CD of a pattern, or the thickness of a thin film by comparing a change in spectrum of a polarization component from a sample with a theoretical spectrum obtained through optical simulation. The above-described measuring methods can measure the corresponding physical quantity in a non-destructive manner, for example, without cutting or separate processing of the sample.

SUMMARY

It is an aspect to provide a spectroscopic measuring apparatus and method that can be efficiently and safely used while accurately measuring the structure or thickness of a micro pattern area.

According to an aspect of one or more embodiments, there is provided a spectroscopic measuring apparatus including a first light source configured to generate and output broadband light; an object lens configured to allow light from the first light source to be incident on a stage configured to support a measurement object; a microlens disposed between the object lens and the stage; an imaging lens configured to image light reflected from the measurement object; an optical fiber having an input terminal disposed on a first image plane of the imaging lens; a spectrometer disposed at an output terminal of the optical fiber; and a position controller configured to control positions of the object lens, the microlens, and the optical fiber, wherein the position controller adjusts the position of the object lens so that a focus of the object lens is positioned at a virtual image position of a virtual image generated by the microlens.

According to another aspect of one or more embodiments, there is provided a spectroscopic measuring apparatus including a first light source configured to generate and output broadband light; an object lens configured to allow light from the first light source to be incident on a stage configured to support a measurement object; a microlens disposed between the object lens and the stage; an imaging lens configured to image light reflected from the measurement object; a branched optical fiber having an input terminal disposed on a first image plane of the imaging lens and having a first output terminal and a second output terminal; a spectrometer disposed at the first output terminal; a second light source disposed at the second output terminal; a detector disposed on a second image plane different from the first image plane; a first beam splitter configured to allow light from the first light source to be incident on the measurement object, and allow light reflected from the measurement object to be incident on the imaging lens; a second beam splitter configured to separate the light from the imaging lens and allow the separated light to be incident on the first image plane and the second image plane; a first control device configured to control a position of the object lens; and a second control device configured to control a position of the microlens, wherein the first control device and the second control device adjust the position of the object lens and the position of the microlens, respectively, so that a focus of the object lens is positioned at a position of a virtual image generated by the microlens.

According to yet another aspect of one or more embodiments, there is provided a spectral measuring method including preparing a spectroscopic measuring apparatus including a first light source, an object lens, a microlens, an imaging lens, an optical fiber, a spectrometer, and a position controller; calibrating a spectral signal by adjusting positions of the object lens and the microlens; and measuring a semiconductor device, which is a measurement object, by using the spectral signal, wherein the calibrating of the spectral signal comprises adjusting, by the position controller, the position of the object lens so that a focus of the object lens is positioned at a virtual image position of a virtual image generated by the microlens.

According to yet another aspect of one or more embodiments, there is provided a semiconductor device fabricating method including preparing a spectroscopic measuring apparatus including a first light source, an object lens, a microlens, an imaging lens, an optical fiber, a spectrometer, and a position controller; calibrating a spectral signal by adjusting positions of the object lens and the microlens; measuring a semiconductor device, which is a measurement object, by using the spectral signal; determining whether the semiconductor device is normal based on a measurement result; and when it is determined that the semiconductor device is normal, performing a subsequent semiconductor process for the semiconductor device, wherein the calibrating the spectral signal comprises adjusting, by the position controller, the position of the object lens so that a focus of the object lens is positioned at a virtual image position of a virtual image generated by the microlens.

BRIEF DESCRIPTION OF THE DRAWINGS

Various embodiments will be more clearly understood from the following detailed description taken in conjunction with the accompanying drawings in which.

DETAILED DESCRIPTION

Figure 1A:
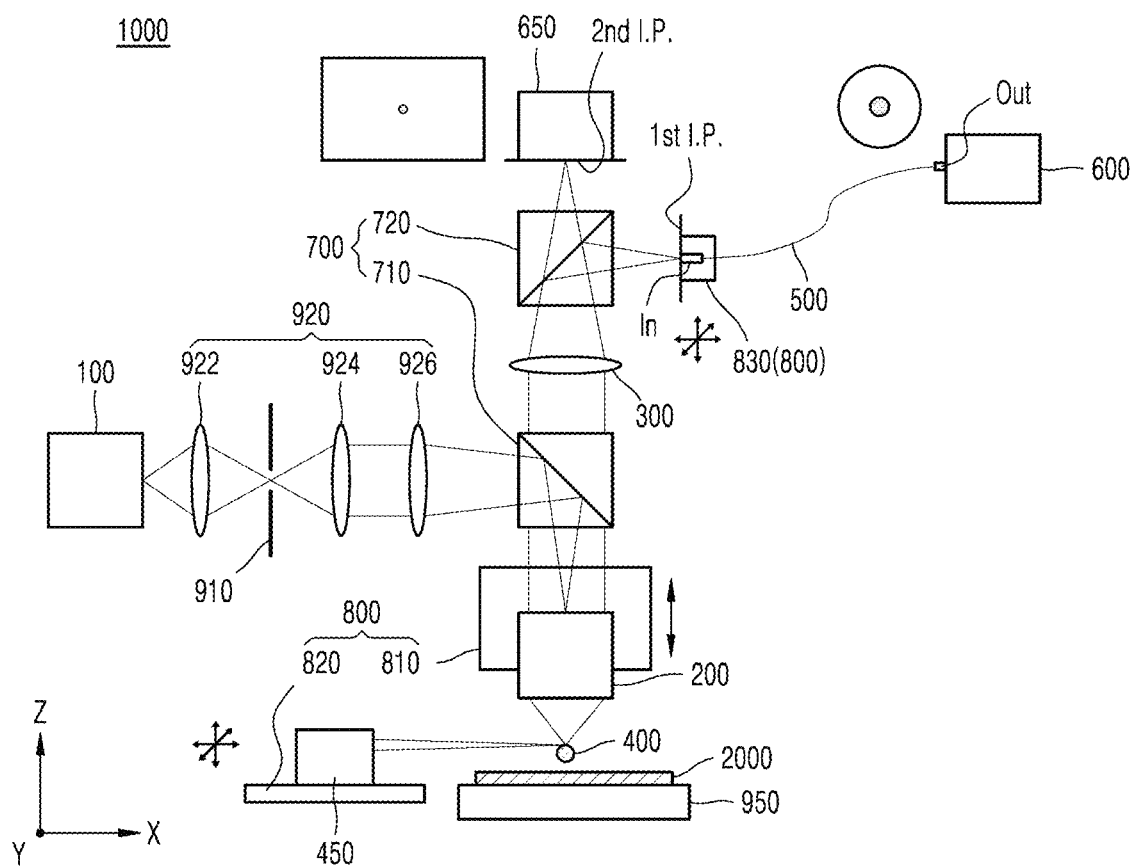
FIG. 1A is a conceptual diagram schematically showing a spectroscopic measuring apparatus according to an embodiment.

Hereinafter, various exemplary embodiments will be described in detail with reference to the accompanying drawings. The same reference numerals are used for the same components in the drawings, and duplicate descriptions thereof are omitted for conciseness.

Figure 1B:
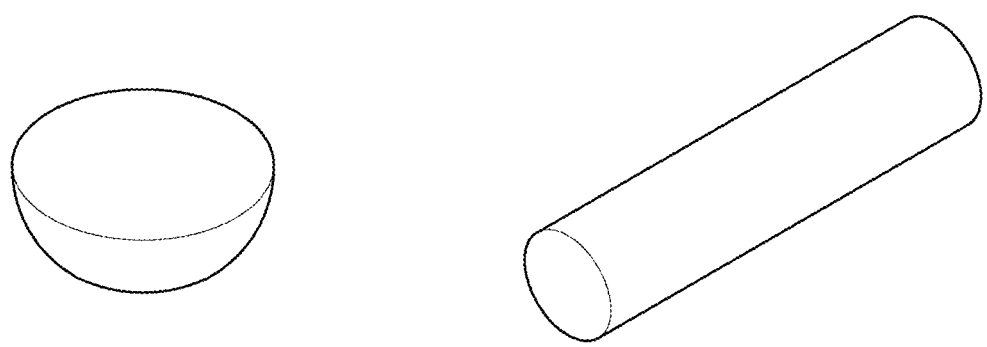
FIG. 1B is a perspective view showing various types of microlenses.

FIG. 1A is a conceptual diagram schematically showing a spectroscopic measuring apparatus according to an embodiment, and FIG. 1B is a perspective view showing various types of microlenses.

Referring to FIGS. 1A and 1B, a spectroscopic measuring apparatus 1000 includes a light source 100, an object lens 200, an imaging lens 300, a microlens 400, an optical fiber 500, a spectrometer 600, a detector 650, a beam splitter unit 700, a position controller 800, and a stage 950.

The light source 100 may be a broadband light source that generates and outputs broadband light including a plurality of wavelengths. Light from the light source 100 may be incident to a first beam splitter 710 of the beam splitter unit 700 through a pinhole 910 and an input optical system 920. In some embodiments, the pinhole 910 may be replaced with an iris. The input optical system 920 may include three lenses, for example, a first lens 922 disposed at the front end of the pinhole 910 and a second lens 924 and a third lens 926 disposed at the rear end of the pinhole 910. However, the number and arrangement positions of lenses included in the input optical system 920 are not limited to the above description.

The object lens 200 may be disposed under the first beam splitter 710 to focus light from the first beam splitter 710 so as to enter a measurement object 2000. That is, the object lens 200 may be disposed in an optical path between the first beam splitter 710 and the stage 950. The imaging lens 300 may be disposed above the first beam splitter 710 to image light from the first beam splitter 710 on the optical fiber 500 and the detector 650. That is, the imaging lens 300 may be disposed in an optical path between the first beam splitter 710 and a second beam splitter of the beam splitter unit 700. The imaging lens 300 may be, for example, a tube lens.

The microlens 400 may be disposed under the object lens 200. That is, the microlens 400 may be disposed in the optical path between the first beam splitter 710 and the stage 950, and more specifically between the object lens 200 and the stage 950. The microlens 400 may be supported by a supporting device 450, for example, a cantilever, and disposed under the object lens 200. The microlens 400 may be, for example, a micro-sphere lens. However, the microlens 400 is not limited to a micro-sphere lens. For example, as shown in FIG. 1B, the microlens 400 may have a shape such as a micro-hemisphere lens or a micro-rod lens.

The microlens 400 may increase the magnification of the spectroscopic measuring apparatus 1000. Accordingly, the microlens 400 may reduce a spot size corresponding to the size of a measurement point to be less than a limit of related art spectroscopic measuring apparatuses.

For reference, in a general related art spectroscopic measuring apparatus, light irradiated from a light source is focused by a condensing lens, irradiated toward a sample as a measurement object, and reflected from the sample, and then is incident on a spectrometer and operates in such a way that the optical intensity is measured for each wavelength. This spectroscopic measuring apparatus obtains the result of the point measurement method in structure, and in order to measure an increasingly smaller semiconductor structure, a size of the light irradiated toward the sample, that is, the size of the spot, which is the size of the measurement point, is continuously required to be reduced. In general, in the case of a Spectroscopic Ellipsometry (SE)-type device, a spot size of at least 25 µm may be obtained by using an oblique optical system method. The spot size of this oblique optical system is determined by the magnification of the pinhole and the condensing lens arranged in the oblique optical system, and in general, because the SE method enters the sample with an incidence angle of about 60° to about 70°, there is a limit to the reduction of the spot size due to the effect of projection.

Furthermore, in order to obtain a smaller spot size than in the oblique optical system, in the case of a spectroscopic measuring apparatus that acquires a spectral signal using a microscope optical system, which is a type of vertical optical system, because the spot size is reduced by the magnification of the microscope optical system, the spot size may be at least 5 µm depending on the magnification. For example, the spot size may be determined by the magnification of the object lens and the core diameter of the optical fiber. Accordingly, as the magnification of the object lens increases, the spot size decreases, but as the magnification of the object lens increases, the Numerical Aperture (NA) increases, and as a result, locality according to the angle of incidence irradiated to the sample may occur, thereby reducing the sensitivity of the spectral signal. In addition, if the core diameter of the optical fiber is made small, the spot size is reduced, but the intensity of the received light is weakened, thereby causing a problem in that the signal-to-noise ratio (SNR) is deteriorated. Due to these problems, a spot size of 1 μm or less is difficult to achieve in a related art spectroscopic measuring apparatus.

On the other hand, the spectroscopic measuring apparatus 1000 according to the embodiment illustrated in FIG. 1A may reduce the spot size to a size less than the limit of the related art spectroscopic measuring apparatus by using the microlens 400. In addition, by precisely adjusting the positions of the object lens 200 and the microlens 400 through the position controller 800, in relation to the physical quantity for which measurement is required, the intensity of light of the measurement target portion of the measurement object 2000 may be accurately acquired through the spectrometer 600. In addition, the image of the measurement target portion of the measurement object 2000 may be clearly detected through the detector 650. Details of obtaining a spectral signal by precisely adjusting the positions of the object lens 200 and the microlens 400 using the position controller 800 is described with respect to FIGS. 4A to 4F.

In the case where the function of the microlens 400 is described in more detail with a micro-sphere lens, when the micro-sphere lens is disposed at an appropriate position, that is, at the lower end of the object lens 200 of the microscope optical system, an effect of improving optical resolution and magnifying magnification may occur. The effect of this micro-sphere lens may be due to the phenomenon in which light incident on the micro-sphere lens passes through the micro-sphere lens, changes the direction of light travel due to the difference in the shape and refractive index of the micro-sphere lens, and is finally collected at a specific point in a very condensed form. This phenomenon is called the photonic jet effect, and when a sample, which is a measurement object 2000, is placed in an appropriate position, depending on the diameter and refractive index of the micro-sphere lens, an effect of magnification of about 3.5 times to about 6 times may be obtained. The photonic jet effect is described in more detail with respect to FIGS. 2A and 2B.

As described above, in general, in order to reduce the spot size, an object lens having a high magnification or an optical fiber having a smaller core diameter may be used, and in this case, the spot size may be reduced arithmetically, but because the optical resolution is still limited by the diffraction limit, it is impossible to obtain a spectral signal for a minute region in a very fine semiconductor pattern. However, in the case of using the microlens 400 such as a micro-sphere lens, optical resolution below the diffraction limit may be obtained even by using a light source in the visible range, and accordingly, it is possible to obtain a spectral signal for a target position in a small region of the semiconductor pattern with high resolution.

The optical fiber 500 may be optically coupled to the imaging lens 300. Specifically, the input terminal In of the optical fiber 500 is disposed on the first image plane 1st I.P. of the imaging lens 300, so that an image by the imaging lens 300 may be formed on the input terminal of the optical fiber 500. The spectrometer 600 may be disposed at the output terminal Out of the optical fiber 500, and light from the imaging lens 300 may be inputted to the spectrometer 600 through the optical fiber.

Moreover, the image plane of the imaging lens 300 may be divided into two positions by the second beam splitter 720 of the beam splitter unit 700. For example, a part of the light from the imaging lens 300 is reflected or transmitted by the second beam splitter 720 and is incident on the first image plane 1st I.P., and the remaining part may be transmitted or reflected by the second beam splitter 720 and incident on a second image plane 2nd I.P. of the detector 650. The detector 650 may be disposed on the second image plane 2nd I.P.

Light incident through the optical fiber 500 may be converted into light intensity for each wavelength by the spectrometer 600 and collected as data. The light intensity data collected in this way may be converted into a spectral signal that may be interpreted. For example, light intensity data may generally be converted into a form of wavelength-specific reflectance or wavelength-specific polarization parameters (delta($\Delta$) and psi($\Psi$)). Here, $\Psi$ denotes a parameter related to p polarization and s polarization, and $\Delta$ denotes a parameter related to phase delay. The spectral signal corresponds to the structure of the measured point, and if the structure of the measured point is different, the spectral signal also changes into a different form. Therefore, the structure of the measurement object may be measured by analyzing the spectral signal. Furthermore, the analysis of the spectral signal may use an analysis method using a matching comparison (fitting) comparing the measured spectral signal with a simulation spectral signal and/or analysis method using an artificial intelligence (AI) learning method.

Figure 9:
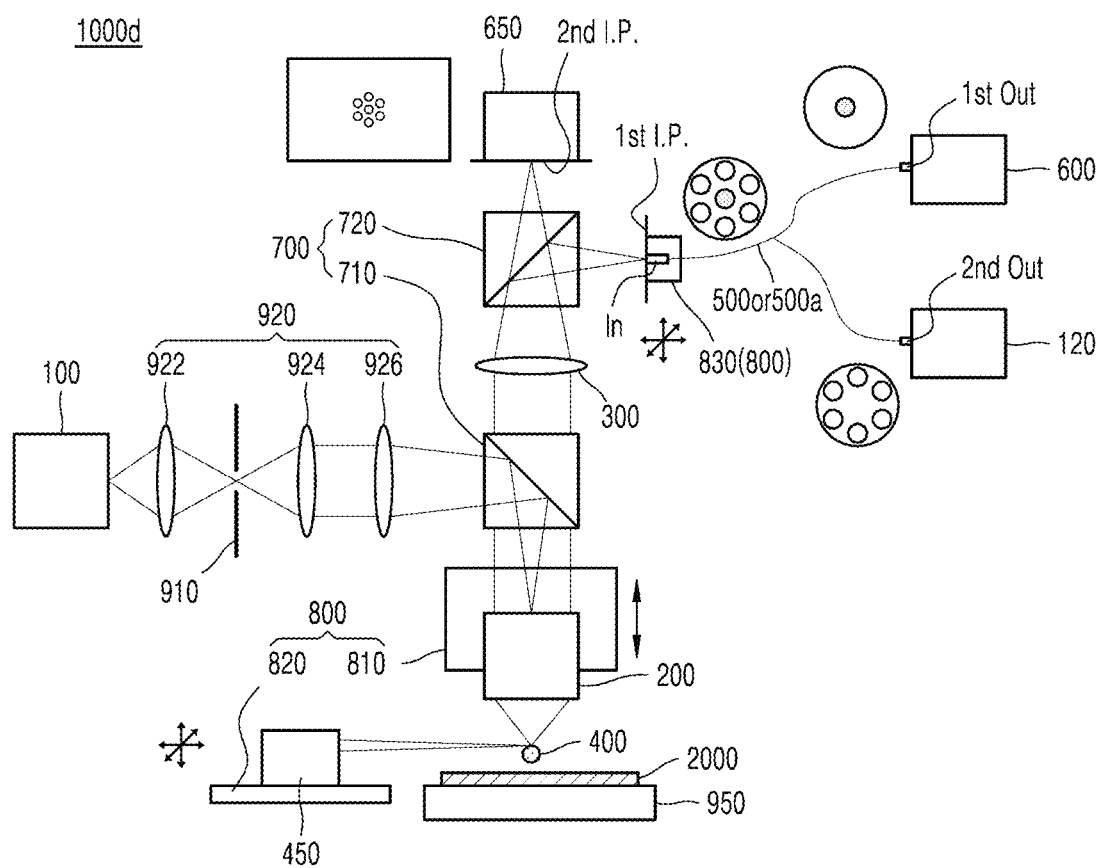
FIGS. 9 and 10 are conceptual diagrams schematically showing spectroscopic measuring apparatuses according to various embodiments.

The detector 650 may be a 2D array detector, and in some embodiments may be, for example, a CCD camera. However, the detector 650 is not limited to the CCD camera. The detector 650 may be disposed on a second image plane 2nd I.P. that may have the similar role as in a general microscope imaging, and may be used for confirming the measurement position in the object plane and the optimum focus position in the optical axis direction. In addition, the detector 650 may detect a spot by the light source 100, and/or a light source for spot position, that is, an additional light source 120 (see embodiment discussed with respect to FIG. 9), and use the spot to check the spot position of the measurement target part of the measurement object 2000. In relation to the spot position confirmation, a more detailed description will be given below in the description of a spectroscopic measuring apparatus 1000b of FIG. 9 provided with an additional light source 120.

The beam splitter unit 700 may include the first beam splitter 710 and the second beam splitter 720. The first beam splitter 710 may reflect or transmit light from the light source 100 to be incident on the measurement object 2000 through the object lens 200, and in addition, transmit or reflect light reflected from the measurement object 2000 and incident through the object lens 200 to be incident on the imaging lens 300. The second beam splitter 720 may reflect or transmit light from the imaging lens 300 to be incident on the first image plane 1st I.P., and in addition, transmit or reflect light from the imaging lens 300 to be incident on the second image plane 2nd I.P.

The position controller 800 may include three control devices, for example, a first control device 810, a second control device 820, and a third control device 830. In some embodiments, the position controller 800 may include one or more microprocessors. In other embodiments, the position controller 800 may include hardware logic. The first control device 810 may control the position of the object lens 200. For example, the first control device 810 may include a microprocessor and/or hardware logic, and arm and motor connected to the object lens 200 and configured to, under control of the microprocessor and/or hardware logic, control a position of the object lens 200. When the upper surface of the stage 950 or the upper surface of the measurement object 2000 corresponds to the x-y plane, the first control device 810 may mainly control a position of the upper surface of the stage 950 or the upper surface of the measurement object 200 in the z direction perpendicular to the x-y plane. However, the first control device 810 is not limited thereto, and in some embodiments, the first control device 810 may control a position on the x-y plane. That is, the first control device 810 may control 3-axis movement of the object lens 200.

The second control device 820 may control the supporting device 450. The second control device 820 may also control 3-axis movement for the supporting device 450. For example, the second control device 820 may include a microprocessor and/or hardware logic, and arm and motor connected to the supporting device 450 and configured to, under control of the microprocessor and/or hardware logic, control the 3-axis movement for controlling a position of the supporting device 450. By controlling the position of the supporting device 450 through the second control device 820, the position of the microlens 400 may be controlled. For example, by controlling the position of the supporting device 450 in the z direction through the second control device 820, the position of the microlens 400 in the z direction may be controlled.

The third control device 830 may control the position of the optical fiber 500 on the first image plane 1st I.P. For example, a spot position in the optical fiber 500 may be precisely controlled through the third control device 830. The third control device 830 may mainly control two-axis movement on the first image plane 1st I.P. For example, the third control device 830 may include a microprocessor and/or hardware logic, and arm and motor connected to the optical fiber 500 and configured to, under control of the microprocessor and/or hardware logic, control the spot position in the optical fiber 500 on the first image plane 1st I.P.

As described above, the pinhole 910 or the iris may be disposed between the lenses of the input optical system 920, and the pinhole 910 or the iris may be disposed to improve the contrast of the image. Meanwhile, although not shown in FIG. 1A, in some embodiments, the spectroscopic measuring apparatus 1000 may further include a two-axis transfer device capable of transferring the position of the pinhole 910 or the iris in a direction perpendicular to the optical axis. In addition, in some embodiments, the spectroscopic measuring apparatus 1000 may further include a polarizer and/or a wave plate to improve signal sensitivity. In the case of polarizer, two polarizers may be disposed, and for example, a first polarizer may be disposed between the light source 100 and the first beam splitter 710, and a second polarizer may be disposed at the front or rear end of the imaging lens 300 between the first beam splitter 710 and the second beam splitter 720.

The stage 950 is an x-y-z stage on which the measurement object 2000 is disposed, and may move the measurement object 2000 in the x, y, and z directions. The stage 950 may adjust the position of the measurement object 2000 so that the spot is positioned at the measurement target position. In addition, when measurement is in progress, by moving the measurement object 2000 on the x-y plane through the stage 950, a scan operation for the measurement object 2000 may be performed.

The measurement object 2000 may be various elements such as a wafer, a semiconductor package, a semiconductor chip, and a display panel. For example, in the spectroscopic measuring apparatus 1000, the measurement object 2000 may be a wafer or a semiconductor device. Here, the wafer or semiconductor device may be a wafer or semiconductor device in which a pattern is formed on a substrate. The pattern may be a periodic pattern such as line-and-space (L/S) or an aperiodic pattern. Further, the wafer or semiconductor device may be a wafer or semiconductor device including a single film or multiple films on a substrate.

The spectroscopic measuring apparatus 1000 of the embodiment illustrated in FIG. 1A may increase the imaging magnification by arranging the microlens 400, for example, a micro-sphere lens at an optimal position under the object lens 200 of the microscope optical system, and in addition, may position the optical fiber 500 on the image plane with magnified magnification, so that spectral signals of very fine regions may be accurately acquired. In addition, by controlling the position of the optical fiber 500 through the position controller 800 on the image plane, the spot position may be precisely transferred by an increased magnification. Furthermore, the spectroscopic measuring apparatus 1000 of the embodiment illustrated in FIG. 1A may estimate the position of a virtual image generated by the microlens 400, as described below, and may rapidly focus the focus of the optical system, that is, the object lens 200, to the virtual image position, so that measurement of the measurement object 2000 may be performed quickly and accurately, and an accident in which the object lens 200 collides with the measurement object 2000 may be prevented. As a result, the spectroscopic measuring apparatus 1000 according to the embodiment illustrated in FIG. 1A may very accurately, and in a non-destructive manner, measure microstructures that cannot be measured by related art SE and SR-based measuring apparatuses in a non-destructive manner, and accordingly, may effectively manage the yield of the semiconductor manufacturing line. For example, the spectroscopic measuring apparatus 1000 according to the embodiment illustrated in FIG. 1A is usefully used for measuring locality in a cell area of DRAM or VNAND, or for measuring a structure of a very narrow area of a memory element such as DRAM or a logic element such as SRAM.

Figure 2A:
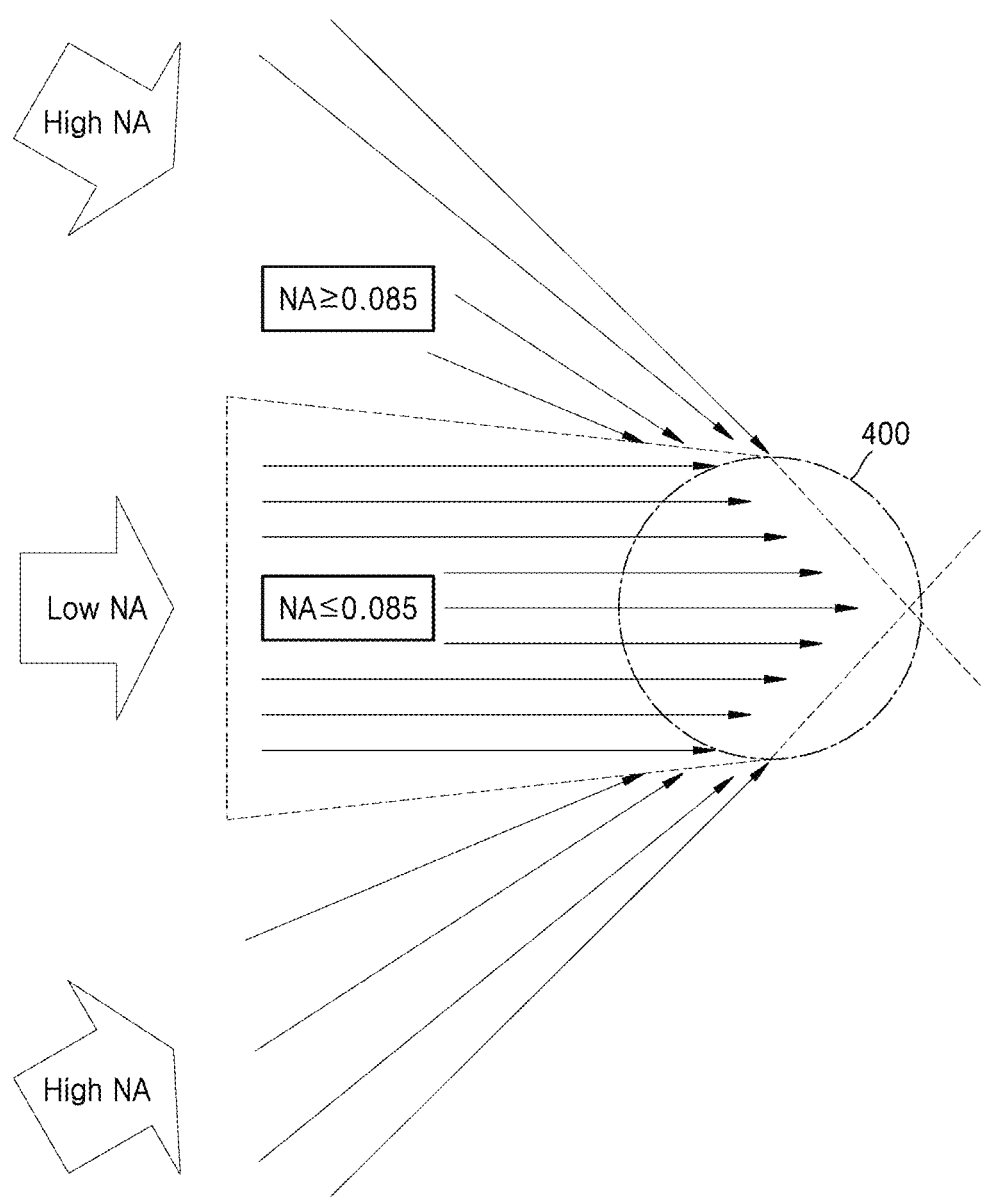
FIGS. 2A and 2B are conceptual diagrams and simulation pictures for explaining the effect of a micro-sphere lens.
Figure 2B:
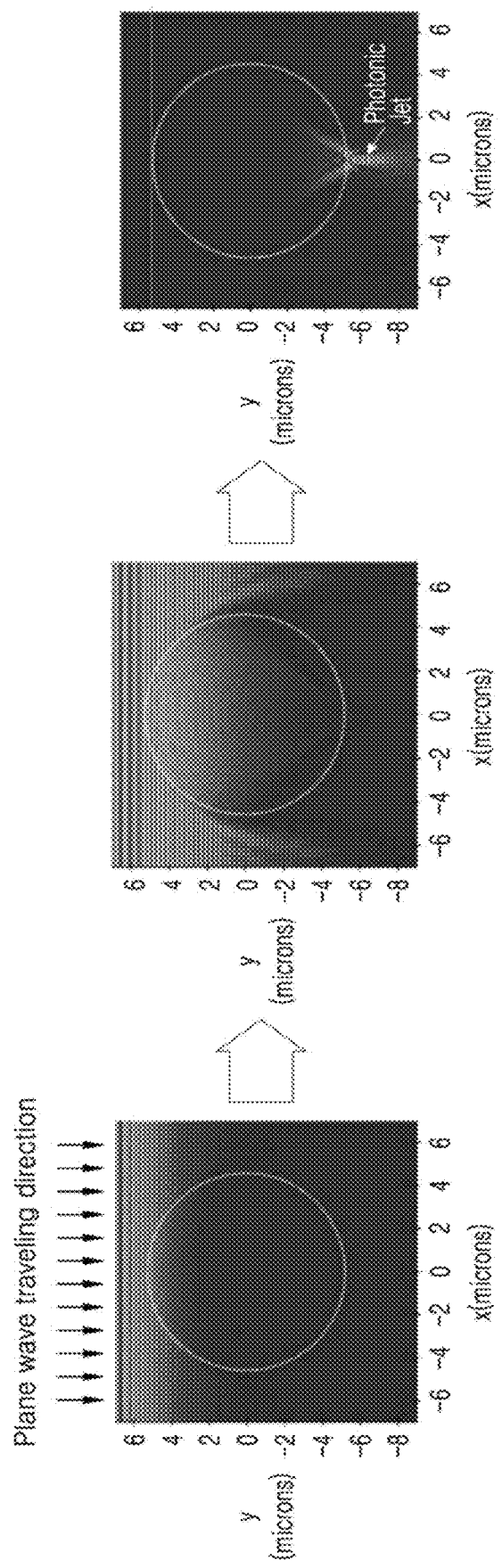

FIGS. 2A and 2B are conceptual diagrams and simulation pictures for explaining the effect of a micro-sphere lens.

Referring to FIG. 2A, light passing through an object lens in a general SE and SR measuring apparatus is incident on a sample, which is a measurement object, while including various angular components indicated by NA, and this may act as a factor that hinders the sensitivity of the spectral signal. In the case of 100× magnification typically used as a high magnification object lens, light has an NA close to 0.8 to 0.9, which may correspond to a maximum angle of incidence of about 53° to about 64°. However, as shown, when using the microlens 400 such as a micro-sphere lens, high incidence angle components High NA (components of the outer portion of the dashed line) from the high magnification object lens are filtered out and only components with low incidence angles Low NA close to parallel light may pass. In FIG. 2A, a portion surrounded by the dashed line may correspond to components having a low incidence angle Low NA. Accordingly, although the NA is decreased by the microlens 400, the optical resolution is rather increased, and as a result, the sensitivity of the spectral signal may be improved.

Referring to FIG. 2B, as described above, the microlens 400 may condense light to the limit through the photonic jet effect. FIG. 2B shows that a plane wave is condensed by a photonic jet effect while passing through a microlens 400 such as a micro-sphere lens through Finite Difference Time Domain Method (FDTD) simulation.

Figure 3:
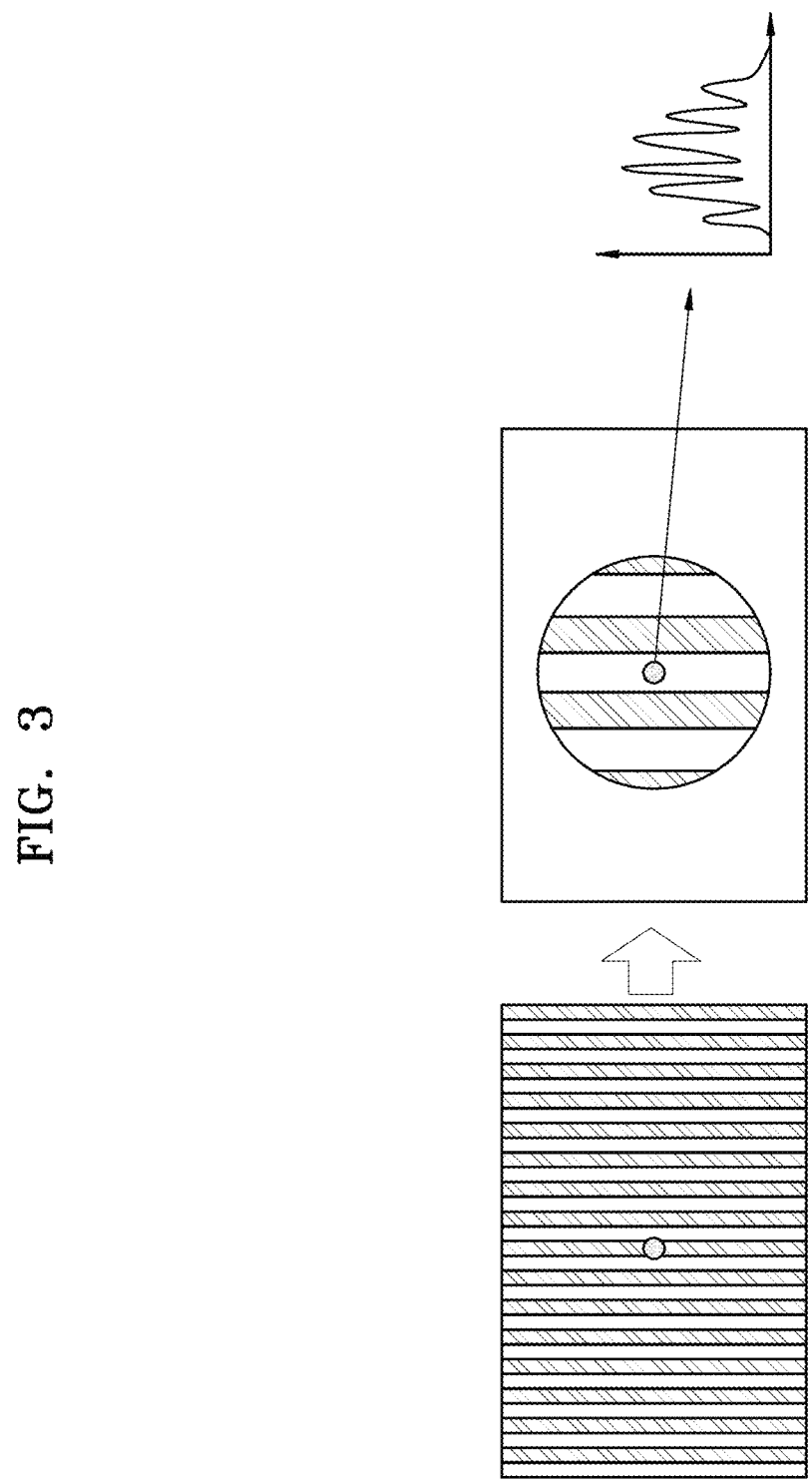
FIG. 3 is a conceptual diagram showing a camera image before and after application of a microlens and a spot in the camera image.

FIG. 3 is a conceptual diagram showing a camera image and a spot in the camera image before and after application of a microlens, and the left is the camera image before the application of the microlens, and the right is the camera image after the application of the microlens, and both are camera images of the same line and space pattern.

Referring to FIG. 3, as seen from the camera image on the left, before applying the microlens 400, for example, a micro-sphere lens, only the magnification effect of the optical system, that is, the object lens 200, exists, and accordingly, the spot size in the camera image may be about the pitch of the pattern or greater than the pitch of the pattern. For example, when the magnification of the object lens 200 is 50× and the pitch of the pattern is about 4 μm, if the core diameter of the optical fiber 500 is about 200 μm, the spot size may be about 200 μm/50=4 μm, which may be similar to the pitch of the pattern.

Furthermore, as seen from the camera image on the right, after applying the microlens 400, for example, a micro-sphere lens, the magnification may be magnified by the micro-sphere lens, and accordingly, the spot size in the camera image may be much less than the pitch of the pattern. For example, under the same conditions as before, when the magnification is magnified by about 4 times by a micro-sphere lens, the overall magnification is 4*50×=200×, and the spot size is about 200 μm/200=1 μm, and thus, may be reduced to almost ¼ of the pitch of the pattern. In the right camera image, for convenience, only the inner pattern of the portion enlarged by the micro-sphere lens is shown, and the outer pattern of the enlarged portion is omitted and not shown. Meanwhile, the spectral signal obtained through the reduced spot by applying a micro-sphere lens to the right of the right camera image is schematically shown through a graph.

FIGS. 4A to 4F are conceptual diagrams for explaining a process of obtaining a spectral signal in the spectroscopic measuring apparatus of FIG. 1A. The process will be described with reference to FIG. 1A.

In order to actually apply and utilize the spectroscopic measuring apparatus 1000 of the embodiment illustrated in FIG. 1A in a semiconductor manufacturing process, it is advantageous to obtain a spectral signal quickly and accurately, and in addition, in order to obtain an enlarged image by using the microlens 400, for example, a micro-sphere lens, it is advantageous for the object lens 200 to approach the measurement object 2000 to a very short distance within several μm. In this approach, it is advantageous to prevent object lens 200 from being damaged or contaminated by contact with the measurement object 2000. For this, the spectroscopic measuring apparatus 1000 of the embodiment illustrated in FIG. 1A accurately estimates the position of the virtual image generated by the micro-sphere lens and moves the focus of the object lens 200 to the position of the virtual image quickly and accurately, and thus, a method of obtaining a clear image and an optimal spectral signal accordingly is achieved.

In the spectroscopic measuring apparatus 1000 of the embodiment illustrated in FIG. 1A, a method of obtaining an optimal spectral signal may be performed through the following operations. Hereinafter, as the microlens 400, a micro-sphere lens will be described as an example.

Figure 4A:
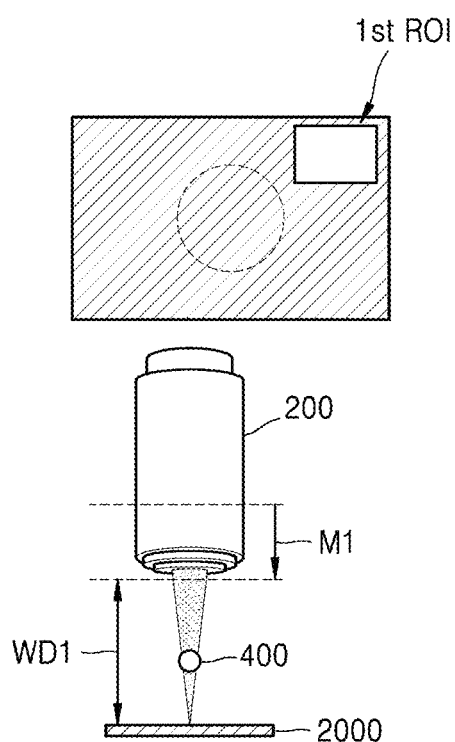
FIGS. 4A to 4F are conceptual diagrams for explaining a process of obtaining a spectral signal in the spectroscopic measuring apparatus of FIG. 1A.

Referring to FIG. 4A, the optical system, that is, the object lens 200, is first moved (M1) to the focal position by first using a first region of interest 1st ROI corresponding to the outside of a region enlarged by a micro-sphere lens in the camera image. In FIG. 4A, a large shaded rectangle drawn at the top corresponds to a camera image, the dashed line circle at the center corresponds to an area enlarged by the micro-sphere lens, and a small unshaded rectangle in the outer portion may correspond to the first region of interest 1st ROI. However, the first region of interest 1st ROI may not be limited to a small rectangle, and in some embodiments all portions outside the dashed line circle may correspond to the first region of interest 1st ROI.

Here, because the first region of interest 1st ROI is a region where the effect of the micro-sphere lens does not occur, the first region of interest 1st ROI is focused at a first distance WD1 corresponding to a working distance of the object lens 200, and the first distance WD1 may correspond to a distance at which the object lens 200 is separated from the upper surface of the measurement object 2000. Accordingly, while first moving (M1) the object lens 200 using the first control device 810 of the position controller 800, the focus position, that is, the first distance WD1, may be calculated by calculating the sharpness of the image within the first region of interest 1st ROI.

Figure 4B:
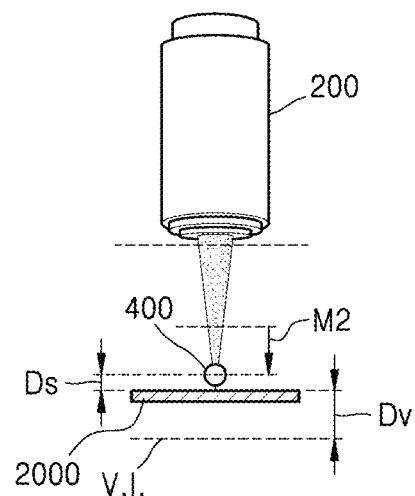

Referring to FIG. 4B, next, the microlens 400 (e.g., the micro-sphere lens) is then moved (M2) toward the measurement object 2000 to approach a position separated by a second distance Ds from the upper surface of the measurement object 2000. In this case, the second distance Ds of the micro-sphere lens may be set in advance by checking the relative distance to the object lens 200. For example, the second distance Ds may be set within 0.5 μm to 2 μm.

After moving the microlens 400 (e.g., the micro-sphere lens), the position at which the virtual image by the microlens 400 (e.g., the micro-sphere lens) is estimated, that is, a third distance Dv may be calculated using the following Equation (1). Here, the third distance Dv may correspond to a distance from the upper surface of the measurement object 2000 to a position V.I. of the virtual image.

$$Dv=Ds^2/(f(n,d)-Ds)+\varepsilon \quad \text{Equation (1)}$$

In Equation (1), f(n,d) denotes a position function of the photonic jet defined in a Finite Difference Time Domain (FDTD) simulation, n denotes a refractive index of the micro-sphere lens, d denotes a diameter of the micro-sphere lens, and c denotes a nonlinear effect.

Figure 4C:
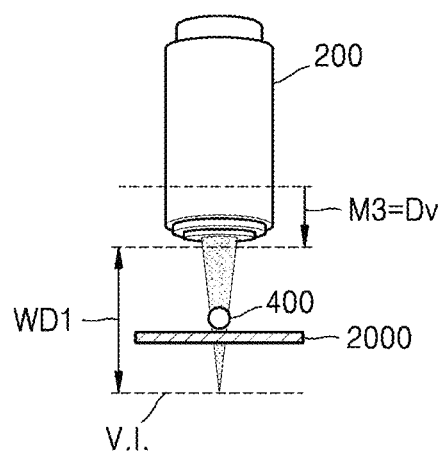

Referring to FIG. 4C, after estimation of the third distance Dv through Equation (1), the optical system, that is, the object lens 200, is moved (M3) toward the measurement object 2000 by the third distance Dv using the first control device 810. By the third movement M3 of the object lens 200, the virtual image by the microlens 400 (e.g., the micro-sphere lens) is positioned under the measurement object 2000, and as a result, the focus of the object lens 200 is roughly adjusted to the position of the virtual image by the micro-sphere lens.

Figure 4D:
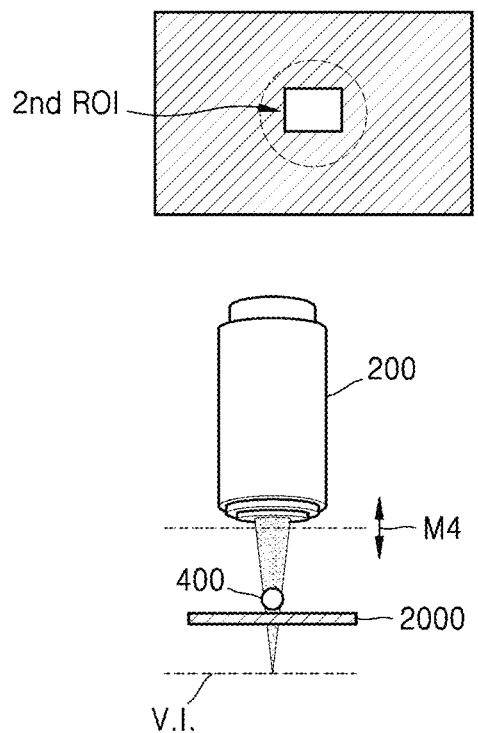

Referring to FIG. 4D, later, in order to precisely align the focus position of the optical system, that is, the object lens 200, with the position of the virtual image, an image is acquired while finely moving the object lens 200. Thereafter, among the acquired images, a focus function is calculated using a partial image of a second region of interest 2nd ROI, and the object lens 200 is moved (M4) to a position having a maximum value of the focus function. Here, the second region of interest 2nd ROI may denote a region within a region enlarged by the microlens 400 (e.g., the micro-sphere lens). For example, in FIG. 4D, the dotted circle in a large shaded rectangle of the upper part corresponds to the area enlarged by the microlens 400 (e.g., the micro-sphere lens), and the small unshaded rectangle in the circle may correspond to the second region of interest 2nd ROI.

Moreover, the focus function may use a Modulation Transfer Function (MTF) calculation equation or sharpness calculation equation. The MTF calculation equation may use, for example, an equation of Contrast=(Imax−Imin)/(Imax+Imin), and Imax and Imix may denote a maximum optical intensity and a minimum optical intensity, respectively.

Figure 4E:
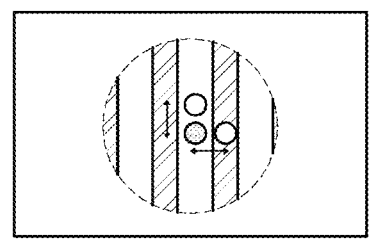
Figure 4E:
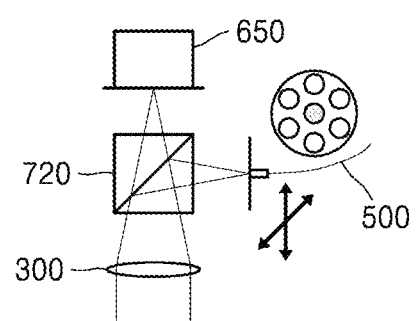

Referring to FIG. 4E, after precisely aligning the focus position of the object lens 200 with the position of the virtual image, while checking the spot position on the camera image, the spot position is adjusted through the stage 950. In some embodiments by using an additional light source 120 (see FIG. 9) and the detector 650 to control the position of the optical fiber 500 through the third control device 830, the spot position may be adjusted very precisely. In this way, when the position of the spot position is adjusted using the additional light source 120 and the third control device 830, the ability to adjust the spot position may be improved by a magnified magnification through a microlens 400 (e.g., a micro-sphere lens). For example, the spot position accuracy may be up to 1 nm or less.

In FIG. 4E, it is shown that the position may be adjusted by moving the spot as indicated by both arrows within the enlarged area of the upper camera image. In addition, corresponding spots are shown in an enlarged area on the incident surface of the optical fiber 500 next to the optical fiber 500, and the spot at the center is a spot used for spectroscopic measurement and detected by the spectrometer 600 and the detector 650, and the surrounding spots are spots by the additional light source 120 and may be detected only by the detector 650. In this way, the position of the spot may be more precisely adjusted using the additional light source 120. The additional light source 120 is described in more detail with respect to FIG. 9.

Figure 4F:
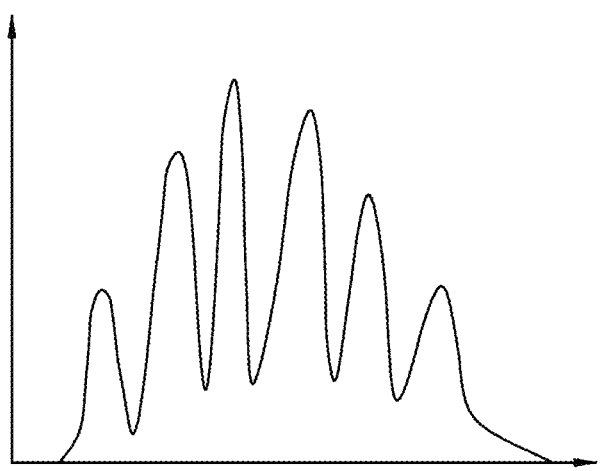

Referring to FIG. 4F, through the above operations, a clear enlarged image of the measurement target area of the measurement object 2000 and an optimal spectral signal according thereto may be obtained. A clear magnified image may be obtained through the detector 650, and an optimal spectral signal may be obtained through the spectrometer 600 connected to the optical fiber 500. FIG. 4F shows a graph of an optimal spectral signal obtained through the spectrometer 600.

Figure 5:
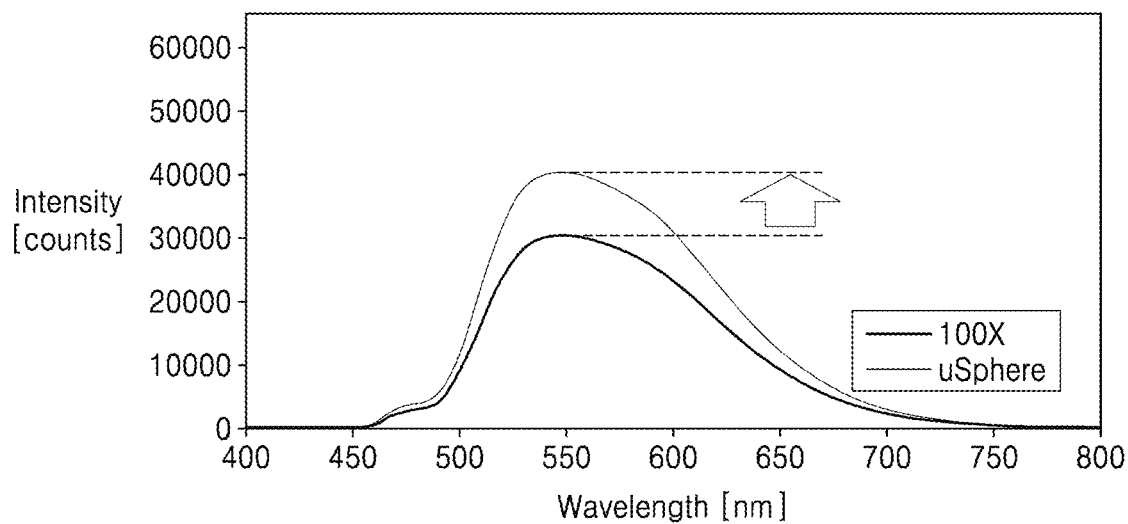
FIG. 5 is a graph showing an effect of increasing intensity according to a decrease in spot size in measurement by the spectroscopic measuring apparatus of FIG. 1A.

FIG. 5 are graphs showing an effect of increasing intensity according to a decrease in spot size in measurement by the spectroscopic measuring apparatus of FIG. 1A. The thick solid line is a graph showing the intensity before the application of the micro-sphere lens, the thin solid line is a graph showing the intensity after the application of the micro-sphere lens, and both are graphs to which the object lens 200 having a magnification of 100× is applied. Furthermore, the y-axis represents the intensity in 16 bits.

Referring to FIG. 5, in general, when the spot size decreases by N times, the intensity decreases by $N^2$. For example, when reducing the diameter of the core of the optical fiber 500 by N times to reduce the spot size by N times, because the light-receiving area is reduced by $N^2$, the intensity may be reduced by $N^2$ accordingly. Also, as the intensity decreases, the SNR may worsen.

On the other hand, when a micro-sphere lens is applied, even though the spot size is reduced by the micro-sphere lens, the intensity may increase due to the photonic-jet effect. For example, as shown in the graph of FIG. 5, even when the spot size is reduced by 3 times by the micro-sphere lens, it can be seen that the intensity increases by about 33%. As a result, the spectroscopic measuring apparatus 1000 of the embodiment illustrated in FIG. 1A reduces the spot size by using the microlens 400, and thus, the problem of reducing the intensity and the SNR according thereto may be solved.

Figure 6A:
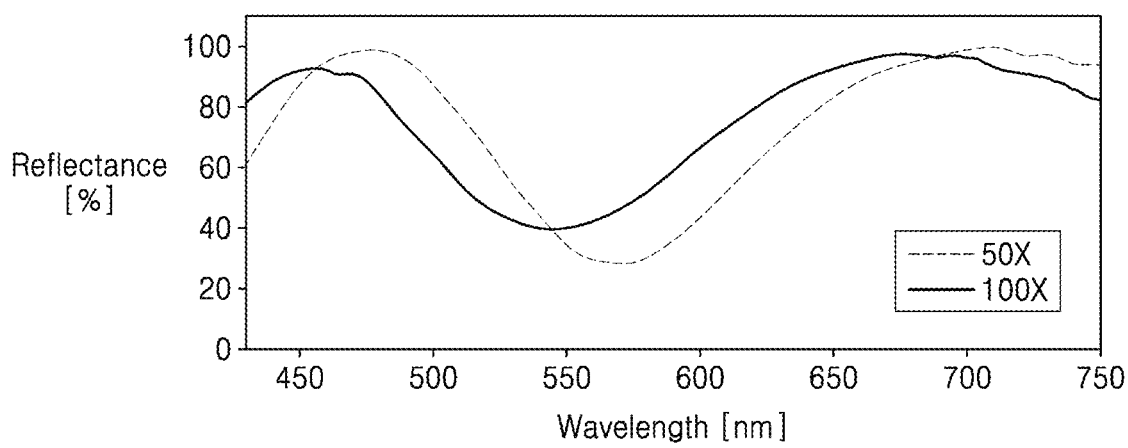
FIGS. 6A and 6B are graphs illustrating a change in a signal according to a decrease in a spot size in measurement by a related art spectroscopic measuring apparatus and the spectroscopic measuring apparatus of FIG. 1A according to an embodiment, respectively.
Figure 6B:
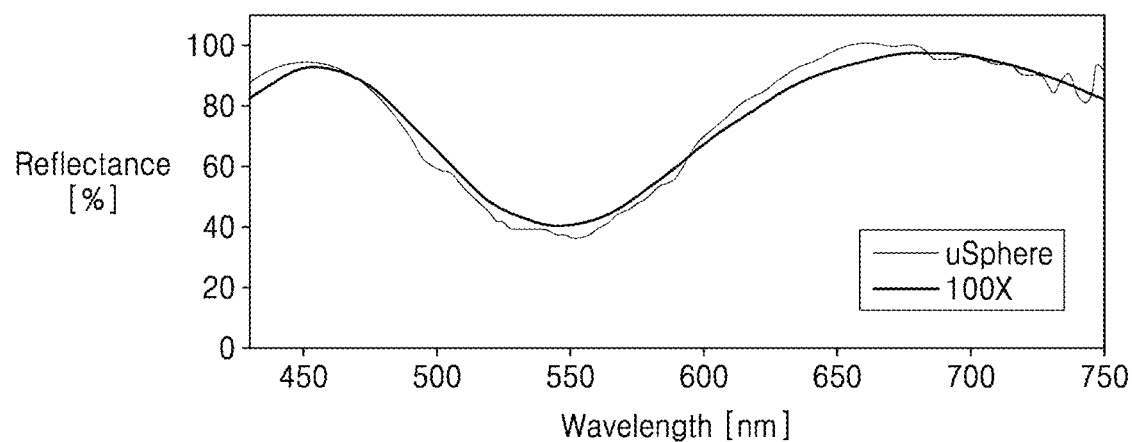

FIGS. 6A and 6B are graphs illustrating a change in a signal according to a decrease in a spot size in measurement by a related art spectroscopic measuring apparatus and the spectroscopic measuring apparatus of the embodiment illustrated in FIG. 1A. In FIG. 6A, the dashed line is a graph of a spot size corresponding to 50× magnification, and the solid line is a graph of spot size corresponding to 100× magnification. In FIG. 6B, the thick solid line is a graph when a micro-sphere lens is not applied, the thin solid line is a graph when a micro-sphere lens is applied, and both are graphs to which an object lens 200 having a magnification of 100× is applied.

Referring to FIG. 6A, when the spot size is reduced by 2 times by increasing the magnification of the optical system, for example, by increasing the magnification of the object lens 200 from 50× to 100× in the existing spectroscopic measuring apparatus, it can be seen that the reflectivity varies according to the wavelength. Through such a change in reflectivity, a signal modification, for example, a signal shift occurrence and a decrease in intensity, may be confirmed. Therefore, when the spot size is reduced through a change in magnification of the optical system, it can be predicted that the sensitivity of the signal may decrease.

Referring to FIG. 6B, even when the magnification is increased, for example, 3 times, to reduce the spot size 3 times, through the application of a micro-sphere lens, it can be seen that the reflectivity according to the wavelength remains almost the same. Through the result of this reflectivity, it may be confirmed that no signal deformation occurs, and therefore, when reducing the spot size by using a micro-sphere lens, it can be predicted that the sensitivity of the signal may be maintained without affecting the signal.

Figure 7A:
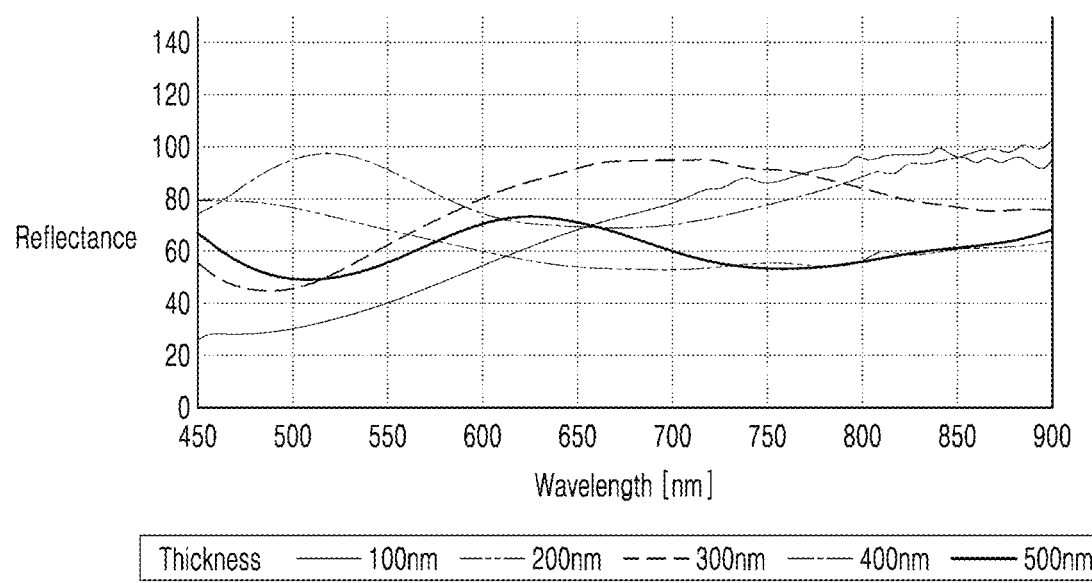
FIGS. 7A to 7C are graphs showing measurement matching in the thickness measurement of a thin film using the spectroscopic measuring apparatus of FIG. 1A.
Figure 7B:
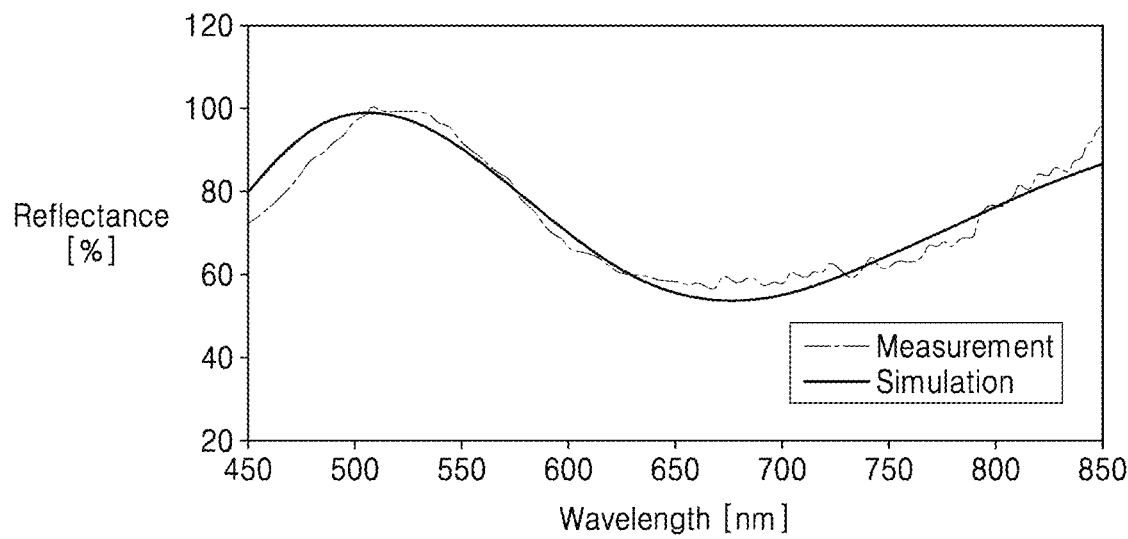
Figure 7C:
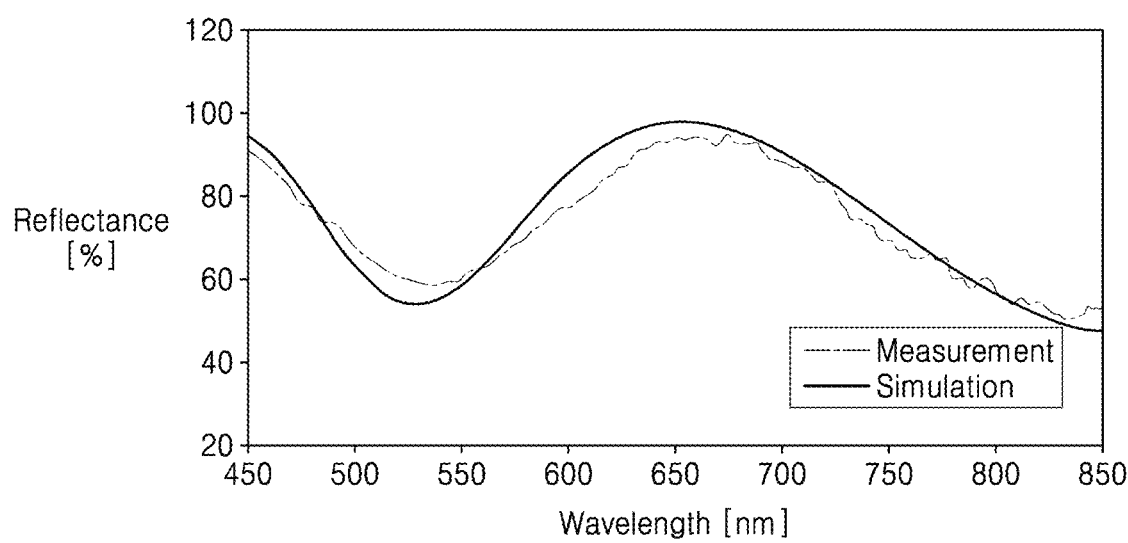

FIGS. 7A to 7C are graphs showing measurement matching in thickness measurement of a thin film using the spectroscopic measuring apparatus of the embodiment illustrated in FIG. 1A. FIG. 7A is a graph of reflectance according to wavelength measured for five thin films having different thicknesses, and FIGS. 7B and 7C are graphs of reflectance according to wavelength showing comparison of measurement data and simulation data for thin films of 400 nm and 500 nm thickness, respectively. Here, the thin film may be, for example, a silicon oxide ($SiO_2$) thin film.

Referring to FIGS. 7A to 7C, as can be seen through the graphs of FIGS. 7B and 7C, for a 400 nm thick thin film and a 500 nm thick thin film, it can be seen that the reflectivity data measured using the spectroscopic measuring apparatus 1000 of the embodiment illustrated in FIG. 1A and the reflectivity data obtained through the simulation substantially coincide. Through the results of these graphs, it may be confirmed that the measurement matching is very high in the thickness measurement of the thin film using the spectroscopic measuring apparatus 1000 of the embodiment illustrated in FIG. 1A.

Figure 8A:
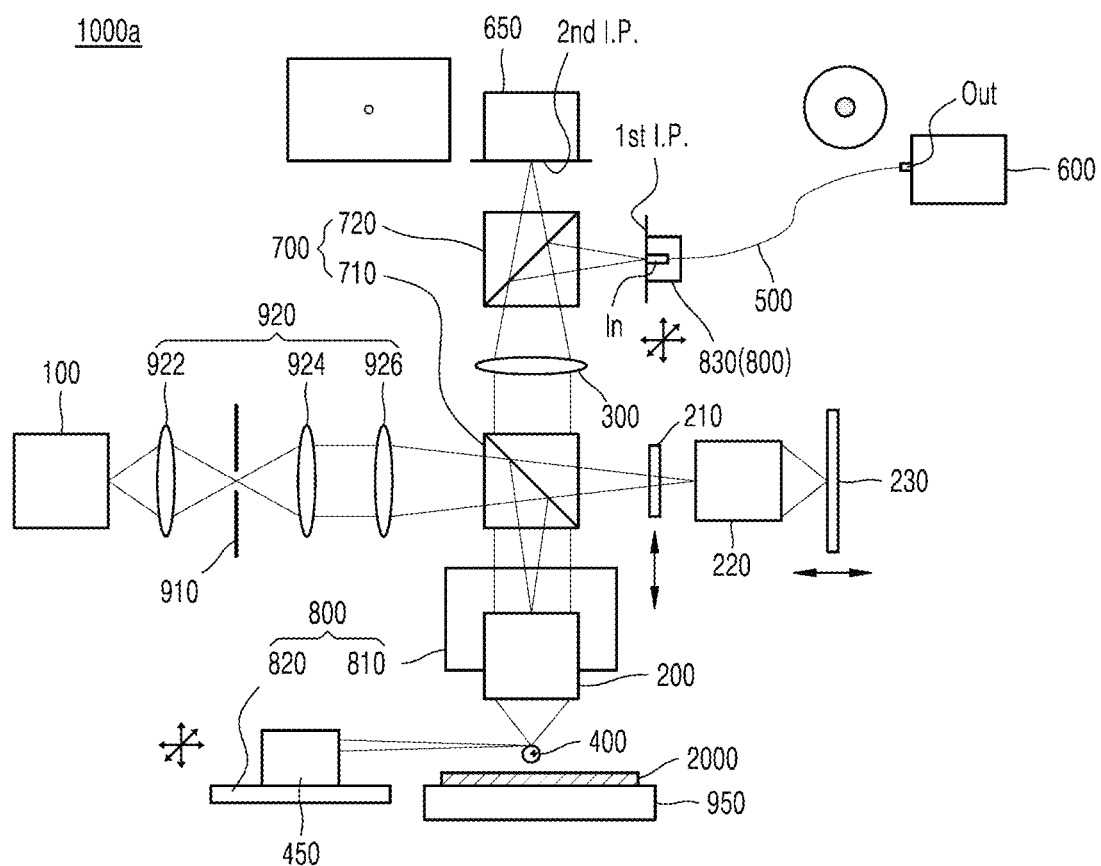
FIGS. 8A to 8C are conceptual diagrams schematically showing spectroscopic measuring apparatuses according to various embodiments.
Figure 8B:
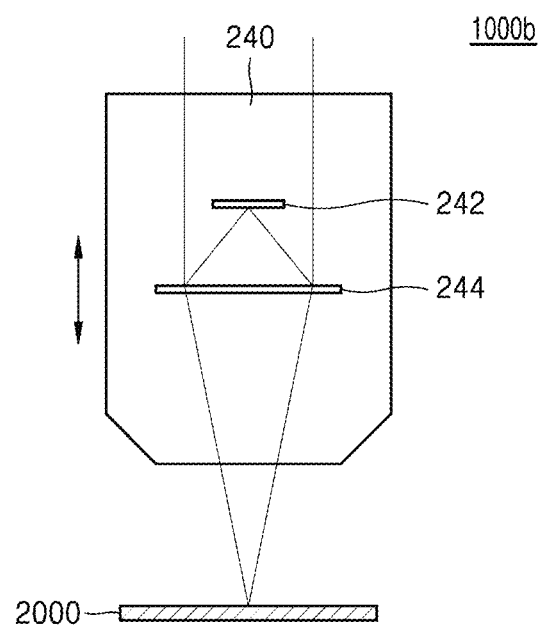
Figure 8C:
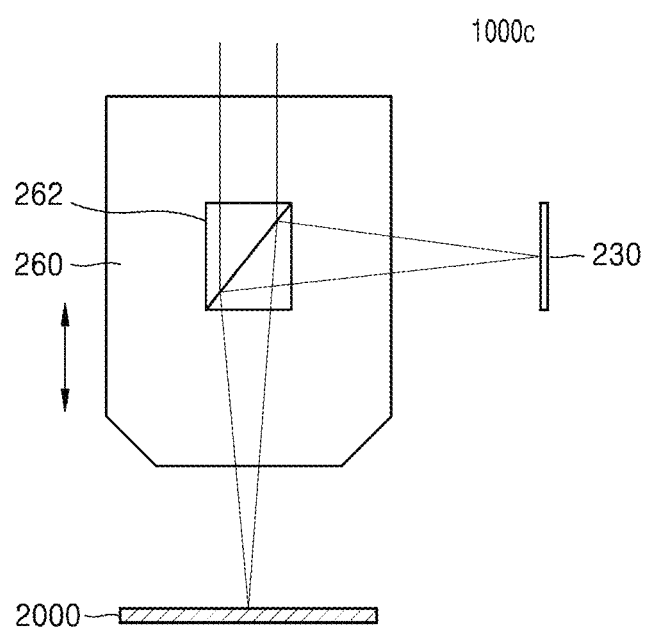

FIGS. 8A to 8C are conceptual diagrams schematically showing spectroscopic measuring apparatuses according to embodiments. For convenience of illustration, FIGS. 8B, and 8C show only a portion corresponding to an object lens in a spectroscopic measuring apparatus. Descriptions already given with respect to FIGS. 1A and 1B are briefly given or omitted for conciseness.

Referring to FIG. 8A, a spectroscopic measuring apparatus 1000a of the embodiment illustrated in FIG. 8A may be different from the spectroscopic measuring apparatus 1000 of the embodiment illustrated in FIG. 1A in that the spectroscopic measuring apparatus 1000a further includes optical elements for generating an interference phenomenon. Specifically, the spectroscopic measuring apparatus 1000a may further include a shutter 210, an interference-dedicated object lens 220, and a reference mirror 230, compared with the spectroscopic measuring apparatus 1000 of the embodiment illustrated in FIG. 1A. An interferometer composed of such optical elements is called a Linnik type interferometer.

In a brief explanation of the operation of the Linnik typed interferometer, the light from the light source 100 passes through the first beam splitter 710, passes through the shutter 210 and the interference-dedicated object lens 220, is reflected by the reference mirror 230, is again incident to the first beam splitter 710, and is combined with light reflected by the measurement object 2000 to generate interference light according to an interference phenomenon. The interfering light may be incident on the optical fiber 500 through the imaging lens 300 and the second beam splitter 720 and detected as a spectral signal by the spectrometer 600.

Consequently, the spectroscopic measuring apparatus 1000*a* of the embodiment illustrated in FIG. 8A acquires and analyzes a spectral signal for the interfering light, so that the physical quantity to be measured of the measurement object 2000 may be measured. Here, the physical quantity to be measured may be, for example, a physical quantity that may be more clearly analyzed through interference light. In addition, by blocking the light through the shutter 210, interference light may be prevented from occurring, and in such a case, the spectroscopic measuring apparatus 1000*a* of the embodiment illustrated in FIG. 8A may operate substantially the same as the spectroscopic measuring apparatus 1000 of the embodiment illustrated in FIG. 1A.

Referring to FIG. 8B, a spectroscopic measuring apparatus 1000*b* of the embodiment illustrated in FIG. 8B may be different from the spectroscopic measuring apparatus 1000 of the embodiment illustrated in FIG. 1A in that the spectroscopic measuring apparatus 1000*b* may include an object lens 240 capable of generating an interference phenomenon. Specifically, the spectroscopic measuring apparatus 1000*b* may include a Mirau-type object lens 240 instead of the object lens 200 of the spectroscopic measuring apparatus 1000 of the embodiment illustrated in FIG. 1A. The object lens 240 may include a first mirror 242 and a second mirror 244 therein. Meanwhile, the second mirror 244 may reflect a part of light to be incident on the first mirror 242, and transmit a part of the light to be incident on the measurement object 2000. In addition, the light reflected from the first mirror 242 and the light reflected from the measurement object 2000 are combined at the second mirror 244 to generate interference light according to the interference phenomenon, and the interference light is incident on the optical fiber 500 through the imaging lens 300 and the second beam splitter 720 and may be detected as a spectral signal by the spectrometer 600.

Although not shown in FIG. 8B, as indicated by both arrows, the spectroscopic measuring apparatus 1000*b* may include a control device capable of moving the object lens 240 in the optical axis direction. For example, the control device may have substantially the same structure and perform substantially the same function as the first control device 810 of the spectroscopic measuring apparatus 1000 of the embodiment illustrated in FIG. 1A.

Referring to FIG. 8C, a spectroscopic measuring apparatus 1000*c* of the embodiment illustrated in FIG. 8C may be different from the spectroscopic measuring apparatus 1000 of the embodiment illustrated in FIG. 1A in that the spectroscopic measuring apparatus 1000*c* may include an object lens 260 that may cause interference and a reference mirror 230. Specifically, the spectroscopic measuring apparatus 1000*c* may include the object lens 260 having an internal beam splitter 262 and a reference mirror 230. An interferometer including the object lens 260 and the reference mirror 230 is referred to as a Michelson type interferometer. The Michelson type interferometer can operate similarly to the Linnik type interferometer. For example, some light may be reflected from the reference mirror 230 through the inner beam splitter 262, and in addition, some light may be reflected from the measurement object 2000 and merged in the inner beam splitter 262 to generate interference light according to an interference phenomenon.

Moreover, although not shown in FIG. 8C, as indicated by both arrows, the spectroscopic measuring apparatus 1000*c* may include a control device capable of moving the object lens 260 in the optical axis direction. For example, the control device may have substantially the same structure and perform substantially the same function as the first control device 810 of the spectroscopic measuring apparatus 1000 of the embodiment illustrated in FIG. 1A. The control device may move the reference mirror 230 together with the object lens 260. In addition, the spectroscopic measuring apparatus 1000*c* may further include a shutter capable of blocking light directed to the reference mirror 230.

Figure 10:
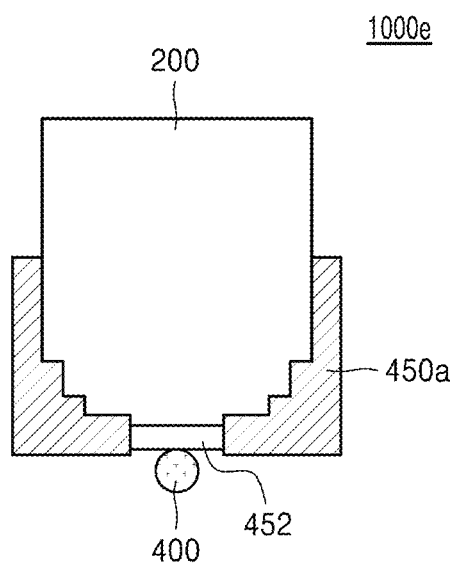

FIGS. 9 and 10 are conceptual diagrams schematically showing spectroscopic measuring apparatuses according to embodiments. For convenience of illustration, FIG. 10 shows only a part corresponding to a microlens and a supporting device in a spectroscopic measuring apparatus. Descriptions already given with respect to FIGS. 1A and 1B are briefly given or omitted for conciseness.

Referring to FIG. 9, the spectroscopic measuring apparatus 1000*d* of the embodiment illustrated in FIG. 9 may be different from the spectroscopic measuring apparatus 1000 of the embodiment illustrated in FIG. 1A in that the spectroscopic measuring apparatus 1000*d* may further include the additional light source 120, and the optical fiber 500*a* has a branched optical fiber structure. Specifically, in the spectroscopic measuring apparatus 1000*d*, the optical fiber 500*a* may have a branched optical fiber structure having one input terminal In and two output terminals Out. For example, the optical fiber 500*a* may have a Y-branched structure such as a reflection probe.

The input terminal In of the optical fiber 500*a* may be disposed on the first image plane 1st I.P. The output terminal Out of the optical fiber 500*a* may include, for example, a first output terminal 1st Out and a second output terminal 2nd Out. The spectrometer 600 may be disposed at the first output terminal 1st Out, and the additional light source 120 may be disposed at the second output terminal 2nd Out. The additional light source 120 may be a light source for checking a spot position. In addition, the second output terminal 2nd Out is a term used for convenience as it is positioned in the opposite direction to the input terminal In, and from the side of the additional light source 120, the second output terminal 2nd Out may be an input part, and the input terminal In may be an output part.

In the spectroscopic measuring apparatus 1000*d* of the embodiment illustrated in FIG. 9, the position of the spot may be checked through the following operation by using the additional light source 120. The light source 100 and the additional light source 120 may be operated together. As in the spectroscopic measuring apparatus 1000 of the embodiment illustrated in FIG. 1A, the light from the light source 100 may be condensed as a spot by the object lens 200 and the microlens 400 and reflected by the measurement object 2000, so that the light may be detected by the detector 650. For example, in FIG. 9, a small circle at a central portion among several small circles in a square camera image shown adjacent to the detector 650 may correspond to a spot caused by light from the light source 100. Meanwhile, the light of the additional light source 120 is inputted through the second output terminal 2nd Out of the optical fiber 500a, inputted to the measurement object 2000 through optical elements and reflected, and then detected by the detector 650 through the optical elements again. For example, in FIG. 9, among a plurality of small circles in the square camera image shown adjacent to the detector 650, small circles surrounding the outer side may correspond to spots caused by light of the additional light source 120.

In this way, the positions of the spots by the light source 100 and the spots by the additional light source 120 may be checked using the detector 650, and through the stage 950, the spot may be adjusted to be positioned at the measurement target position. In addition, by controlling the position of the optical fiber 500a on the first image plane 1st I.P. using the third control device 830, the spot position may be more precisely controlled. This is to adjust the position of the small circle corresponding to the spot in the large circle corresponding to the enlarged area by the microlens 400, and the position of the spot may be more precisely adjusted by the increased magnification. Moreover, small circles corresponding to the center spot and the outer spots inside the large circle are shown together adjacent to the input terminal In and as mentioned above, the center spot may be outputted to the spectrometer 600 as a spot by the light source 100 and the outer spots may be outputted to the second beam splitter 720 as spots by the additional light source 120. Therefore, although two types of spots cannot be detected together through the optical fiber 500a, they are shown together for convenience in order to show the positional relationship.

Meanwhile, in the operation of checking the position of the spot, the spectrometer 600 may not operate. In addition, when measurement is performed on the measurement object 2000, the additional light source 120 may not operate, and only the spectrometer 600 may operate. Meanwhile, when measurement is performed on the measurement object 2000, the detector 650 may selectively operate.

Referring to FIG. 10, the spectroscopic measuring apparatus 1000e of the embodiment illustrated in FIG. 10 may be different from the spectroscopic measuring apparatus 1000 of the embodiment illustrated in FIG. 1A in the structure of the supporting device 450a. Specifically, in the spectroscopic measuring apparatus 1000e, the supporting device 450a supports the microlens 400, but may have a housing structure surrounding the outer portion of the object lens 200. The supporting device 450a includes a transparent cover 452 at the bottom, and a microlens 400 may be attached on the upper or lower surface of the transparent cover 452. Furthermore, although not shown in FIG. 10, similar to the first control device 810 of the spectroscopic measuring apparatus 1000 of the embodiment illustrated in FIG. 1A, the spectroscopic measuring apparatus 1000e may further include a control device that controls the movement of the supporting device 450a. For example, the control device may have substantially the same structure and perform substantially the same function as the first control device 810 of the spectroscopic measuring apparatus 1000 of the embodiment illustrated in FIG. 1A. By moving the supporting device 450a using the control device, the microlens 400 may be moved.

Figure 11:
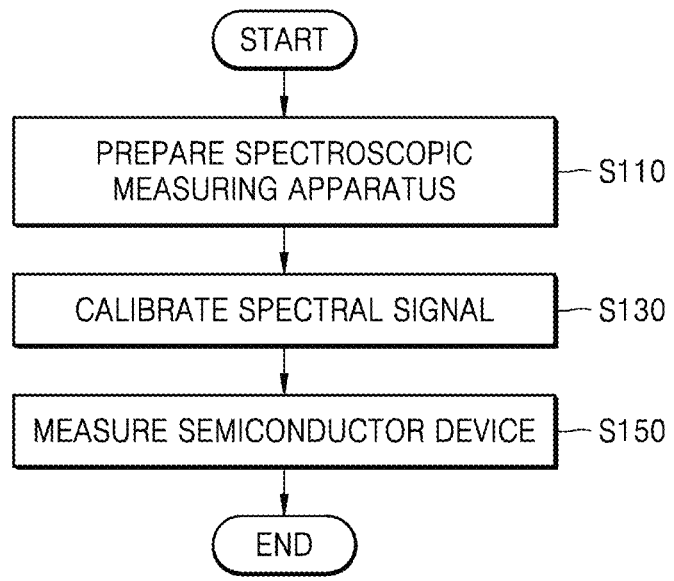
FIG. 11 is a simplified flowchart showing a spectral measuring method according to an embodiment.

FIG. 11 is a simplified flowchart showing a spectral measuring method according to an embodiment. It will be described with additional reference to FIG. 1A, and the contents already described in the description of FIG. 1A are briefly given or omitted for conciseness.

Referring to FIG. 11, in the spectral measuring method of the embodiment illustrated in FIG. 11, a spectroscopic measuring apparatus 1000 is prepared (S110). In the spectral measuring method, the spectroscopic measuring apparatus 1000 is not limited to the spectroscopic measuring apparatus 1000 of the embodiment illustrated in FIG. 1A, and may be any one of the spectroscopic measuring apparatuses 1000a to 1000e of the embodiments illustrated in FIGS. 8A to 10.

Next, the spectroscopic measuring apparatus 1000 calibrates the spectral signal (S130). Calibration of the spectral signal may be achieved by adjusting the positions of the object lens 200, the microlens 400, and the optical fiber 500 of the spectroscopic measuring apparatus 1000 using the position controller 800. The calibration of the spectral signal may correspond to a process of obtaining an optimal spectral signal in the description of FIGS. 4A to 4F. The calibration of the spectral signal is described in more detail with respect to FIGS. 12A and 12B below.

After the spectral signal is calibrated, a semiconductor device, which is a measurement object, is measured through the spectroscopic measuring apparatus 1000 (S150). In other words, the semiconductor device is measured with the calibrated optimal spectral signal. Accordingly, in the spectral measuring method of the embodiment illustrated in FIG. 11, by measuring the semiconductor device with an optimal spectral signal, while accurately measuring semiconductor devices, it is possible to measure efficiently and safely. The operation S150 of measuring the semiconductor device will be described in more detail below in the description of FIG. 12C. In addition, before the operation S150 of measuring the semiconductor device, a semiconductor process may be performed on a wafer or the like to manufacture a semiconductor device, which is a measurement object.

Figure 12A:
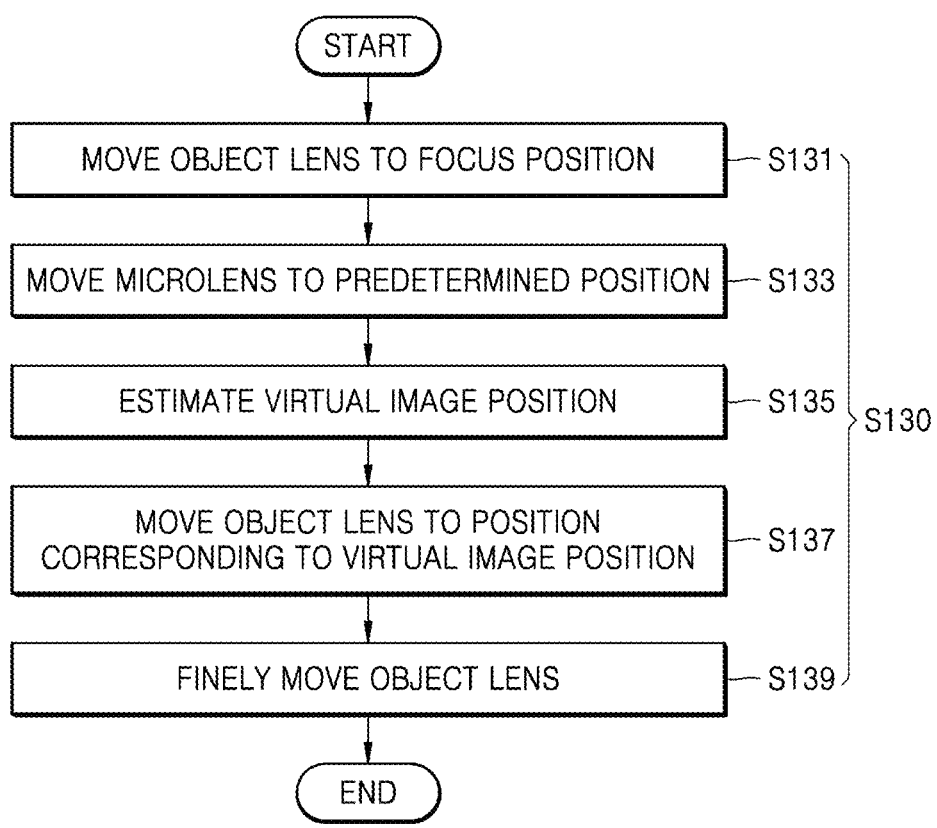
FIGS. 12A to 12C are flowcharts showing in more detail an operation of calibrating a spectral signal in the spectroscopic measuring method of FIG. 11, according to an embodiment, and a more detailed flowchart showing an operation of measuring a semiconductor device, according to an embodiment.
Figure 12B:
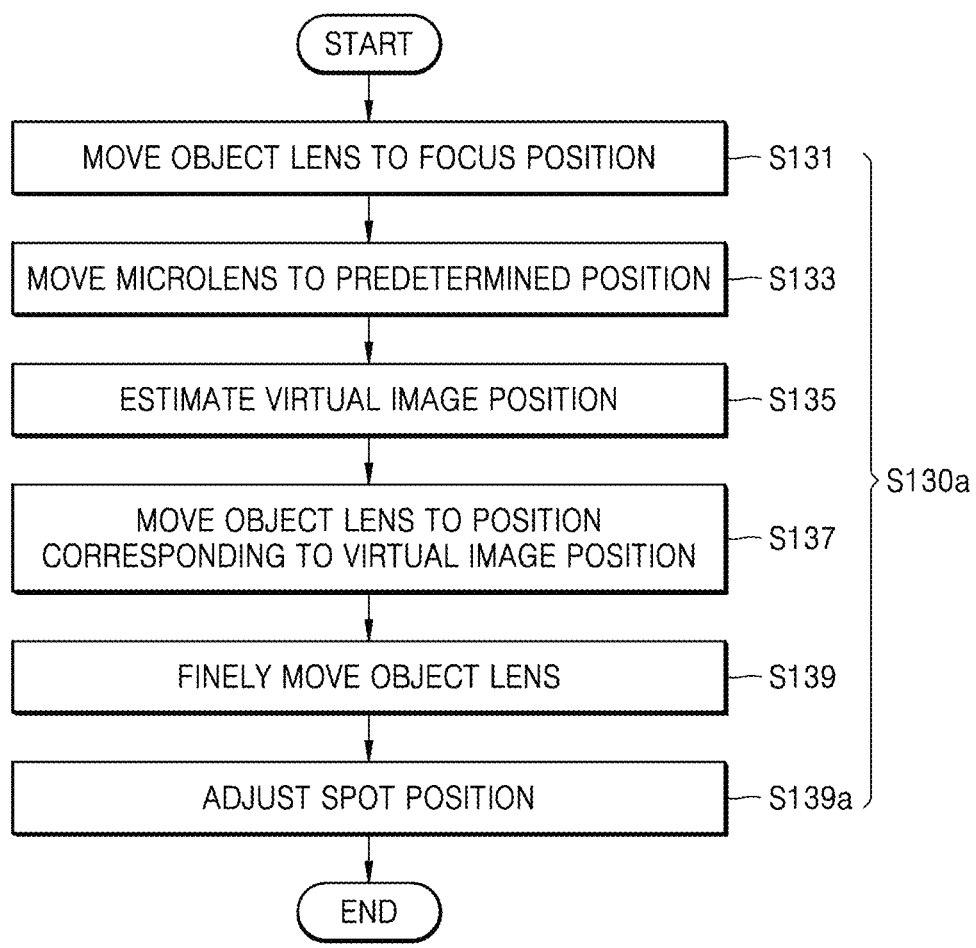
Figure 12C:
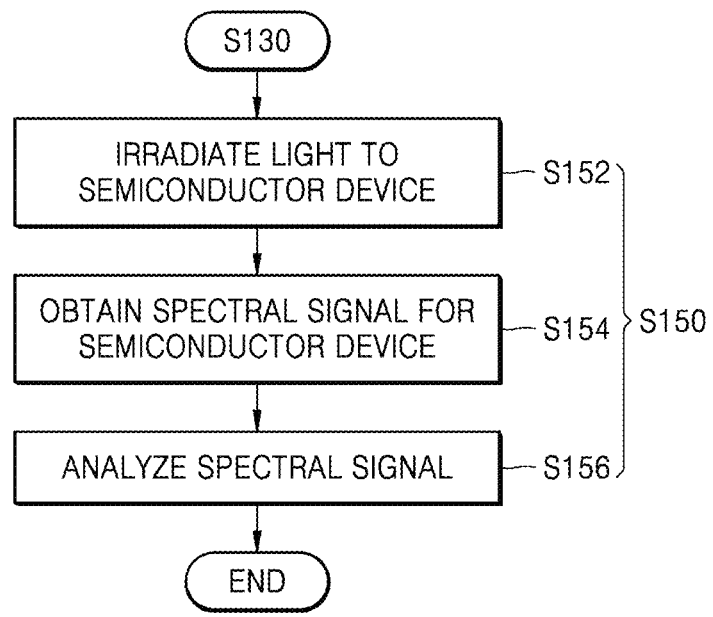

FIGS. 12A to 12C are flowcharts showing in more detail an operation of calibrating a spectral signal in the spectroscopic measuring method of FIG. 11, and a more detailed flowchart showing an operation of measuring a semiconductor device. The description will be made with reference to FIGS. 1A and 4A to 4F together, and the contents already described in the description of FIGS. 1A and 4A to 4F are briefly given or omitted for conciseness.

Referring to FIG. 12A, in the operation S130 of calibrating the spectroscopic signal in the spectroscopic measuring method of the embodiment illustrated in FIG. 12A, the object lens 200 is first moved to a focal position (S131). The focus position is a working distance of the object lens 200, and may denote a position in which the object lens 200 is spaced apart from the upper surface of the measurement object 2000 by a first distance WD1 in FIG. 4A. Accordingly, the first movement of the object lens 200 may refer to a movement of positioning the object lens 200 at a position corresponding to the first distance WD1. The first distance WD1 may be calculated by calculating the sharpness of the image using a first region of interest 1st ROI, which is an area where the effect of the microlens 400 does not occur.

The microlens 400 is moved to a predetermined position (S133). Here, the predetermined position may denote a position at which the microlens 400 is spaced apart from the upper surface of the measurement object 2000 by a second distance Ds, as illustrated in FIG. 4B. The second distance Ds may be set in advance by checking the relative distance to the object lens 200.

The position of the virtual image generated by the microlens 400 is estimated (S135). Estimating the position of the virtual image may denote calculating a third distance Dv, which is a distance from the upper surface of the measurement object 2000 to the position of the virtual image. The third distance Dv may be calculated using Equation (1) described in the description of FIG. 4B.

After the virtual image position is estimated, the object lens 200 is moved to a position corresponding to the virtual image position (S137). That is, the object lens 200 is moved so that the focus of the object lens 200 comes to the estimated virtual image position. The movement of the object lens 200 so that the focus of the object lens 200 comes to the estimated virtual image position may denote moving the object lens 200 toward the measurement object 2000 by the previously calculated third distance Dv. Through the movement of the object lens 200, the focus of the object lens 200 may be roughly adjusted to the virtual image position.

After the movement of the object lens 200, the object lens 200 is finely moved (S139). Through the fine movement of the object lens 200, the focus of the object lens 200 may be precisely aligned with the virtual image position. The fine movement of the object lens 200 may be achieved through calculation of a focus function using a second region of interest 2nd ROI within a region where the effect of the microlens 400 occurs. Calibration of the spectral signal may be completed through fine movement of the object lens 200. By calibrating the spectral signal, a clear image of the measurement target area of the measurement object 2000 and an optimal spectral signal according thereto may be obtained.

Referring to FIG. 12B, in the spectral measuring method of the embodiment illustrated in FIG. 12B, in the aspect that the operation S130a of calibrating the spectral signal further includes an operation S139a of adjusting the spot position after fine movement of the object lens 200, the operation S130a may be different from the operation S130 of calibrating the spectral signal of the embodiment illustrate in FIG. 12A. The spot position may be adjusted using the camera image of the detector 650. In addition, as described with a spectroscopic measuring apparatus 1000d of FIG. 9, the position of the spot may be precisely adjusted by using the additional light source 120 for checking the position of the spot and the detector 650. Specifically, the spot position adjustment may check the spot position on the camera image using the detector 650 and/or the additional light source 120, and may be achieved by moving the stage 950 and/or moving the optical fiber 500 using the third control device 830.

Referring to FIG. 12C, according to the spectral measuring method of the embodiment illustrated in FIG. 12C, in the operation S150 of measuring the semiconductor device, light is irradiated from the light source 100 of the spectroscopic measuring apparatus 1000 to the semiconductor device (S152). Light from the light source 100 may be irradiated to the semiconductor device through various optical elements described in the description of the embodiment illustrated in FIG. 1A. In particular, light from the light source 100 may be reduced to a very small spot size through the object lens 200 and the microlens 400 and irradiated to the semiconductor device.

The spectrometer 600 obtains a spectral signal for the semiconductor device (S154). As the light reflected from the semiconductor device passes through optical elements and enters the spectrometer 600, and is then spectrographed by the spectrometer 600, the spectral signal for the semiconductor device may be obtained. Moreover, the reflected light from the semiconductor device may be incident in a spot form through the input terminal In of the optical fiber 500 disposed on the first image plane 1st I.P. of the imaging lens 300, and may be detected by the spectrometer 600 disposed at the output terminal Out of the optical fiber 500.

The spectral signal is analyzed (S156). It can be determined whether the semiconductor device is normal through analysis of the spectral signal. An analysis method through matching comparison that compares the measured spectral signal with a simulated spectral signal and/or an analysis method using an artificial intelligence (AI) learning method may be used for the analysis of the spectral signal.

Figure 13:
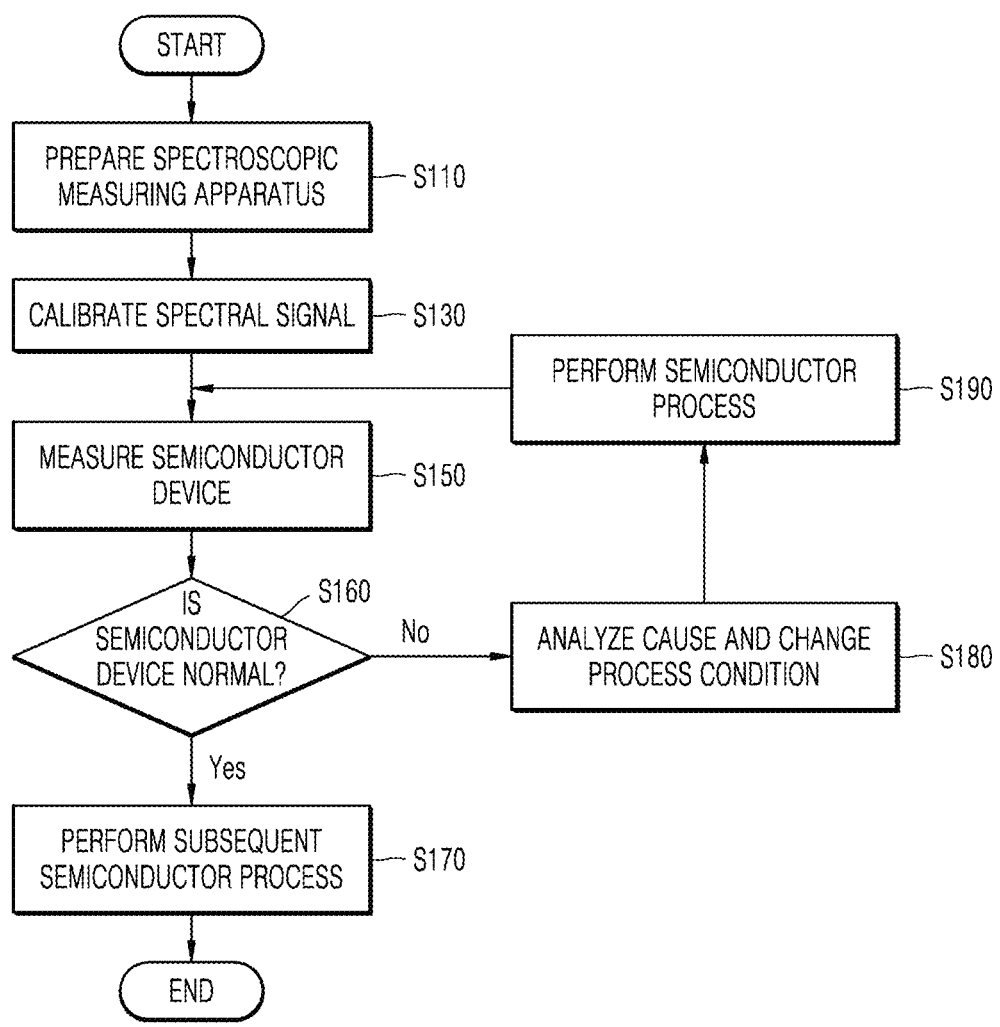
FIG. 13 is a simplified flowchart illustrating a semiconductor device fabricating method according to an embodiment.

FIG. 13 is a simplified flowchart illustrating a semiconductor device fabricating method according to an embodiment. It will be described with reference to FIG. 1A and FIGS. 11-12C, and the contents already described in the description of FIGS. 1A and 11 to 12C are briefly given or omitted for conciseness.

Referring to FIG. 13, the semiconductor device fabricating method of the embodiment illustrated in FIG. 13 sequentially performs an operation S110 of preparing the spectroscopic measuring apparatus 1000 to an operation S150 of measuring a semiconductor device as described with respect to the embodiment of FIG. 11. Each of the operation S110 of preparing the spectroscopic measuring apparatus 1000, the operation S130 of calibrating the spectral signal, and the operation S150 of measuring the semiconductor device is the same as that in the description of FIG. 11.

It is determined whether the semiconductor device is normal based on the measurement result (S160). The determination of whether the semiconductor device is normal may be made based on, for example, an analysis method through matching comparison used for analysis of spectral signals and/or an interpretation method using artificial intelligence (AI) learning method. For example, the determination may be performed by one or more microprocessors executing program code for implementing the analysis method to make the determination.

If the semiconductor device is normal (operation S160, Yes), a subsequent semiconductor process is performed (S170). The subsequent semiconductor process may include various processes. For example, the subsequent semiconductor process may include a deposition process, an etching process, an ion process, a cleaning process, and the like. Further, the subsequent semiconductor process may include a test process of a semiconductor device at a wafer level. Furthermore, the subsequent semiconductor process may include a process of individualizing a wafer into semiconductor chips, and a process of packaging the semiconductor chips. A semiconductor device may be completed through such a subsequent semiconductor process.

If the semiconductor device is not normal (operation S160, No), the cause is analyzed and the process conditions are changed (S180). Here, the process conditions may denote, for example, process conditions in a semiconductor process of manufacturing a semiconductor device. When taking a lithography process as an example, if the cause is poor focus, the focus position may be changed, and if the cause is poor dose, the amount of dose may be changed. Thereafter, the semiconductor process is performed by applying the changed process conditions S190, and the process proceeds to the operation S150 of measuring the semiconductor device. The semiconductor device measured in the operation S150 of measuring the semiconductor device may be a semiconductor device to which a changed process condition is applied.

While various embodiment have been particularly shown and described, it will be understood that various changes in form and details may be made therein without departing from the spirit and scope of the following claims.

What is claimed is:

1. A spectroscopic measuring apparatus comprising:
a first light source configured to generate and output broadband light;
an object lens configured to allow light from the first light source to be incident on a stage configured to support a measurement object;
a microlens disposed between the object lens and the stage;
an imaging lens configured to image light reflected from the measurement object;
an optical fiber having an input terminal disposed on a first image plane of the imaging lens;
a spectrometer disposed at an output terminal of the optical fiber; and
a position controller configured to control positions of the object lens, the microlens, and the optical fiber,
wherein the position controller adjusts the position of the object lens so that a focus of the object lens is positioned at a virtual image position of a virtual image generated by the microlens.

2. The spectroscopic measuring apparatus of claim 1, wherein the position controller comprises:
a first control device configured to control the position of the object lens;
a second control device configured to control the position of the microlens; and
a third control device configured to control the position of the optical fiber,
wherein the first control device and the second control device adjust the position of the object lens and the position of the microlens, respectively, so that the focus of the object lens is positioned at the virtual image position.

3. The spectroscopic measuring apparatus of claim 2, wherein the microlens comprises a micro-sphere lens, and wherein:
the first control device controls the object lens to move the object lens to a position spaced apart by a first distance from an upper surface of the measurement object so that the focus of the object lens is positioned on an upper surface of the measurement object;
the second control device controls the micro-sphere lens to move the micro-sphere lens to a position spaced apart by a second distance from the upper surface of the measurement object, the second distance being different from the first distance;
the first control device controls the object lens to move the object lens so that the focus of the object lens is positioned at the virtual image position; and
the first control device controls the object lens to finely move the object lens.

4. The spectroscopic measuring apparatus of claim 3, wherein the first control device controls the object lens to move the object lens so that the focus of the object lens is positioned at the virtual image position based on the following Equation (1) for estimating a third distance between the upper surface of the measurement object and the position of the virtual image, the third distance being different from the first distance and the second distance, $$Dv=Ds^2/(f(n,d)-Ds)+\varepsilon \qquad \text{Equation (1)}$$

where Dv denotes the third distance, F(n,d) denotes a position function of a photonic jet defined in a Finite Difference Time Domain Method (FDTD) simulation, n denotes a refractive index of the microlens, d denotes a diameter of the microlens, and ε denotes a nonlinear effect, and
wherein the first control device moves the object lens in a direction of the measurement object by the third distance.

5. The spectroscopic measuring apparatus of claim 3, wherein the first control device controls the object lens to move the object lens to a position spaced apart by a first distance from the upper surface of the measurement object by using a first area outside an area enlarged by the microlens, and
wherein the first control device controls the object lens to finely move the object lens by using a second area inside the enlarged area.

6. The spectroscopic measuring apparatus of claim 3, the position controller is further configured to adjust a spot position.

7. The spectroscopic measuring apparatus of claim 1, wherein the optical fiber comprises a first output terminal and a second output terminal,
wherein the spectrometer is disposed at the first output terminal,
wherein the spectroscopic measuring apparatus further comprises a second light source disposed at the second output terminal, and a detector disposed on a second image plane different from the first image plane,
wherein a spot position is checked using the second light source and the detector.

8. The spectroscopic measuring apparatus of claim 7, further comprising a first beam splitter and a second beam splitter,
wherein the first beam splitter allows light from the first light source to be incident on the measurement object, and allows the light reflected from the measurement object to be incident on the imaging lens, and
wherein the second beam splitter separates the light from the imaging lens and allows the separated light to be incident on the first image plane and the second image plane.

9. The spectroscopic measuring apparatus of claim 1, wherein the microlens comprises a micro-sphere lens, a micro-hemisphere lens, or a micro-rod lens.

10. The spectroscopic measuring apparatus of claim 1, wherein the spectroscopic measuring apparatus further comprises a plurality of optical elements for generating an interference phenomenon, or
wherein the object lens is an object lens that generates an interference phenomenon.

11. The spectroscopic measuring apparatus of claim 1, further comprising a pin-hole or an iris disposed at an output terminal side of the first light source.

12. The spectroscopic measuring apparatus of claim 1, further comprising a supporting device, wherein the microlens is attached to and supported by the supporting device,
wherein the position controller controls the supporting device to move the supporting device to control the position of the microlens.

13. A spectroscopic measuring apparatus comprising:
a first light source configured to generate and output broadband light;
an object lens configured to allow light from the first light source to be incident on a stage configured to support a measurement object;
a microlens disposed between the object lens and the stage;

an imaging lens configured to image light reflected from the measurement object;

a branched optical fiber having an input terminal disposed on a first image plane of the imaging lens and having a first output terminal and a second output terminal;

a spectrometer disposed at the first output terminal;

a second light source disposed at the second output terminal;

a detector disposed on a second image plane different from the first image plane;

a first beam splitter configured to allow light from the first light source to be incident on the measurement object, and allow light reflected from the measurement object to be incident on the imaging lens;

a second beam splitter configured to separate the light from the imaging lens and allow the separated light to be incident on the first image plane and the second image plane;

a first control device configured to control a position of the object lens; and a second control device configured to control a position of the microlens, wherein the first control device and the second control device adjust the position of the object lens and the position of the microlens, respectively, so that a focus of the object lens is positioned at a position of a virtual image generated by the microlens.

14. The spectroscopic measuring apparatus of claim 13, wherein the microlens is a micro-sphere lens, and wherein the first control device controls the object lens to move the object lens to a position spaced apart by a first distance from an upper surface of the measurement object so that the focus of the object lens is positioned on an upper surface of the measurement object;

the second control device controls the micro-sphere lens to move the micro-sphere lens to a position spaced apart by a second distance from the upper surface of the measurement object, the second distance being different from the first distance;

the first control device controls the object lens to move the object lens so that the focus of the object lens is positioned at the position of the virtual image; and the first control device controls the object lens to finely move the object lens.

15. The spectroscopic measuring apparatus of claim 14, wherein the first control device controls the object lens to move the object lens so that the focus of the object lens is positioned at the position of the virtual image based on the following Equation (1) for estimating a third distance between the upper surface of the measurement object and the position of the virtual image, the third distance being different from the first distance and the second distance, $$Dv = Ds^2/(f(n,d) - Ds) + \varepsilon \qquad \text{Equation (1)}$$

where Dv denotes the third distance, F(n,d) denotes a position function of a photonic jet defined in a Finite Difference Time Domain Method (FDTD) simulation, n denotes a refractive index of the microlens, d denotes a diameter of the microlens, and $\varepsilon$ denotes a nonlinear effect, and wherein the first control device moves the object lens in a direction of the measurement object by the third distance.

16. The spectroscopic measuring apparatus of claim 14, further comprising a third control device configured to control a position of the branched optical fiber, wherein the first control device controls the object lens to move the object lens to the position spaced apart by the first distance from the upper surface of the measurement object by using a first area outside an area enlarged by the microlens, wherein the first control device controls the object lens to finely move the object lens by using a second area inside the enlarged area, wherein the first control device controls the object lens to finely move the object lens, the spectroscopic measuring apparatus is further configured to adjust a spot position.

* * * * *